United States Patent
Kabe et al.

(10) Patent No.: US 8,105,958 B2
(45) Date of Patent: Jan. 31, 2012

(54) SEMICONDUCTOR DEVICE MANUFACTURING METHOD AND PLASMA OXIDATION TREATMENT METHOD

(75) Inventors: Yoshiro Kabe, Amagasaki (JP); Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 610 days.

(21) Appl. No.: 11/573,586

(22) PCT Filed: Aug. 11, 2005

(86) PCT No.: PCT/JP2005/014725
§ 371 (c)(1),
(2), (4) Date: Feb. 12, 2007

(87) PCT Pub. No.: WO2006/016642
PCT Pub. Date: Feb. 16, 2006

(65) Prior Publication Data
US 2008/0032511 A1   Feb. 7, 2008

(30) Foreign Application Priority Data
Aug. 13, 2004   (JP) .................. 2004-236059

(51) Int. Cl.
*H01L 21/31* (2006.01)
*H01L 21/469* (2006.01)
*H01L 21/4763* (2006.01)

(52) U.S. Cl. . 438/772; 438/592; 438/788; 257/E21.179; 257/E21.301

(58) Field of Classification Search .......... 438/592, 438/771, 788, 772; 257/E21.301, E21.179
See application file for complete search history.

(56) References Cited

U.S. PATENT DOCUMENTS

| | | | | |
|---|---|---|---|---|
| 6,357,385 B1 * | 3/2002 | Ohmi et al. | ............ | 118/723 AN |
| 6,987,056 B2 * | 1/2006 | Lim et al. | ............ | 438/585 |
| 2002/0187656 A1 * | 12/2002 | Tan et al. | ............ | 438/788 |
| 2007/0218687 A1 | 9/2007 | Sugawara et al. | | |

FOREIGN PATENT DOCUMENTS

| | | |
|---|---|---|
| CN | 1489784 A | 4/2004 |
| JP | 1 186675 | 7/1989 |
| JP | 8 102534 | 4/1996 |
| JP | 8 111297 | 4/1996 |
| JP | 11 293470 | 10/1999 |
| JP | 2000 332245 | 11/2000 |
| KR | 10-2004-0059753 | 7/2004 |
| KR | 10-2004-0059988 | 7/2004 |
| WO | 02 073696 | 9/2002 |

* cited by examiner

*Primary Examiner* — Matthew Landau
*Assistant Examiner* — Daniel Luke
(74) *Attorney, Agent, or Firm* — Oblon, Spivak, McClelland, Maier & Neustadt, L.L.P.

(57) ABSTRACT

A selective oxidation process is performed on a gate electrode in a plasma processing apparatus 100. A wafer W with the gate electrode formed thereon is placed on a susceptor 2 within a chamber 1. Ar gas, $H_2$ gas, and $O_2$ gas are supplied from an Ar gas supply source 17, an $H_2$ gas supply source 18, and an $O_2$ gas supply source 19 in a gas supply system 16 through a gas feed member 15 into the chamber 1. At this time, a flow rate ratio $H_2/O_2$ of $H_2$ gas relative to $O_2$ gas is set to be 1.5 or more and 20 or less, preferably to be 4 or more, and more preferably to be 8 or more. Further, the pressure inside the chamber is set to be 3 to 700 Pa, such as 6.7 Pa (50 mTorr).

18 Claims, 14 Drawing Sheets

Ar/H₂/O₂ PLASMA

SEMICONDUCTOR DEVICE MANUFACTURING METHOD AND PLASMA OXIDATION TREATMENT METHOD

TECHNICAL FIELD

The present invention relates to a method for manufacturing a semiconductor device by use of plasma in processing a semiconductor substrate, and further to a method for performing a plasma oxidation process.

BACKGROUND ART

In recent years, owing to the demands for higher integration degrees and higher operation speeds of LSIs, design rules for semiconductor devices that constitute LSIs are increasingly miniaturized. Along with this trend, the resistivity of transistor gate electrodes used in DRAMs, flash memories, and so forth is required to be lower. Conventionally, poly-silicon is used for gate electrodes, but entailing a disadvantage such that it increases the sheet resistance. Accordingly, it has been proposed to laminate a poly-silicon layer with a refractory metal, such as tungsten, or silicide of the metal, which is low in resistivity, high in adhesion to a silicon oxide film or silicon itself, and good in processability. Specifically, a tungsten polycide gate (a laminated film of WSi/poly-Si) and a tungsten poly-metal gate (a laminated structure of W/WN/poly-Si) with a lower resistivity have attracted attention. The WN of the tungsten poly-metal gate serves as a barrier layer (diffusion prevention layer) for preventing a reaction between tungsten and poly-silicon.

In general, where a transistor gate is set up, a well (impurity diffusion layer), a gate insulating film, and a gate electrode are formed in this order. When the gate electrode is formed, an etching process is performed. With this process, a side surface of a poly-silicon layer included in the gate electrode is exposed. When a voltage is applied to the gate electrode, an electric field is concentrated at this exposed portion, which may cause malfunctions of the product, such as an increase in leakage current. Accordingly, it is necessary to perform a selective oxidation process (so-called re-oxidation process) to oxidize the exposed poly-silicon portion of the gate electrode, thereby forming an insulating film thereon.

As a re-oxidation method for forming an insulating film on the exposed portion of a poly-silicon layer on the side surface of a gate electrode, it is typical to adopt a method using a thermal oxidation process at a high temperature of 800° C. or more. However, tungsten and tungsten silicide that are used for decreasing the sheet resistance of gate electrodes are rapidly oxidized when the temperature exceeds about 300° C. and about 400° C., respectively. Consequently, when a thermal oxidation process is performed on a gate electrode, a tungsten layer is also oxidized and $WO_3$ is thereby generated. The $WO_3$ thus generated brings about cubical expansion that narrows the inside of holes, as well as an increase in resistivity. Thus, a problem arises such that the resistance of the gate electrode is increased. Further, $WO_3$ may be scattered and contaminate a wafer, thereby causing a problem in that the process yield for semiconductor devices is decreased. Furthermore, at such a high temperature, tungsten may react with poly-silicon and increase the resistivity due to diffusion of tungsten nitride (WN) of the diffusion prevention layer. In addition, thermal oxidation processes entail difficulty in forming an optimum sidewall oxide film of high quality, and need a relatively long time. Consequently, thermal oxidation processes make it difficult not only to control formation of the oxide film but also to improve the throughput, thereby decreasing the productive efficiency.

On the other hand, as a method for forming an oxide film other than a thermal oxidation process, there has been proposed a method by use of plasma for forming an oxide film on a substrate for, e.g., liquid crystal displays, although this method is not for the purpose of re-oxidation of a gate electrode (for example, Patent Document 1). According to this method, a silicon oxide film is deposited on a substrate under the action of plasma to form the silicon oxide film. At this time, hydrogen gas is supplied in addition to a silicon-containing gas and an oxygen-containing gas into a process chamber to generate hydrogen-containing plasma. With this arrangement, it is expected to attain a film of high quality comparable to thermal oxide films.

In the method of Patent Document 1 described above, the hydrogen plasma is used for filling defects in the oxide film, which suits for formation of an oxide film of high quality on a substrate. However, this Document suggests no application to selective re-oxidation for a poly-silicon layer included in a gate electrode.

According to studies made by the present inventors, it has been confirmed that, where the poly-silicon layer of a gate electrode having a metal layer, such as a tungsten layer, is preferentially oxidized by plasma, if hydrogen plasma is present, oxidation of the metal layer is suppressed to a considerable extent. However, it has been found that, even if oxidation of the tungsten layer is suppressed, a large amount of tungsten is mixed into semiconductor devices as a metal contaminant at atomic level, and the contamination thus caused reaches a level not negligible for the performance of the semiconductor devices. In other word, tungsten thus mixed may affect semiconductor devices, such as transistors, and cause malfunctions of the product, thereby decreasing the process yield.

Further, the present inventors have tried to perform a re-oxidation process by use of a plasma processing apparatus of the RLSA (Radial Line Slot Antenna) microwave plasma type, which can realize a low temperature process by plasma having a high plasma density and a low electron temperature.

However, it has been confirmed that, in the process of performing the re-oxidation process by use of the plasma processing apparatus of the RLSA type, if the chamber is contaminated with tungsten, oxidation of poly-silicon is inhibited and the thickness of an oxide film thus formed is decreased, although the mechanism for this is still unexplained. Where a plasma processing apparatus of the RLSA type is applied to a re-oxidation process, it is possible to provide many merits. However, if the oxide film thickness is decreased, semiconductor products suffer an increase in leakage current and so forth, which make it difficult to attain the original purpose of the re-oxidation.

[Patent Document 1]
Jpn. Pat. Appln. KOKAI Publication No. 11-293470 (Claims)

DISCLOSURE OF INVENTION

Accordingly, a first object of the present invention is to improve a re-oxidation process utilizing plasma, so as to perform selective oxidation for oxidizing a poly-silicon layer of a gate electrode without oxidizing a metal layer thereof, such as a tungsten layer or tungsten silicide layer.

A second object is to suppress contamination of a semiconductor device due to a metal, such as tungsten, in the re-oxidation process, as far as possible.

A third object is to improve a re-oxidation process by use of a plasma processing apparatus of the RLSA type, so as to reliably perform the re-oxidation process without decreasing the oxide film thickness on the poly-silicon layer According to a first aspect of the present invention, there is provided a semiconductor device manufacturing method performed on a laminated structure, which includes at least a poly-silicon layer and a metal layer containing a refractory metal as a main component, the method comprising:

subjecting the laminated structure to a plasma process by use of a process gas containing hydrogen gas and oxygen gas, thereby forming an oxide film on the poly-silicon layer, within a plasma processing apparatus including a planar antenna with a plurality of slots formed therein, by which microwaves are supplied into a process chamber to generate plasma.

According to a second aspect of the present invention, there is provided a semiconductor device manufacturing method comprising:

forming a gate insulating film on a semiconductor substrate;

forming a laminated structure, which includes at least a poly-silicon layer and a metal layer containing a refractory metal as a main component, on the gate insulating film;

forming a gate electrode from the laminated structure by an etching process; and subjecting the gate electrode to a plasma process by use of a process gas containing hydrogen gas and oxygen gas, thereby preferentially oxidizing a poly-silicon layer in the gate electrode, within a plasma processing apparatus including a planar antenna with a plurality of slots formed therein, by which microwaves are supplied into a process chamber to generate plasma.

According to a third aspect of the present invention, there is provided a plasma oxidation method performed on a laminated structure, which includes at least a poly-silicon layer and a metal layer containing a refractory metal as a main component, for preferentially oxidizing the poly-silicon layer by plasma, the method comprising:

performing a plasma process by use of a process gas containing hydrogen gas and oxygen gas, within a plasma processing apparatus including a planar antenna with a plurality of slots formed therein, by which microwaves are supplied into a process chamber to generate plasma.

The process gas is supplied such that a flow rate ratio of hydrogen gas relative to oxygen gas is preferably 1.5 or more, more preferably 2 or more, and furthermore preferably 8 or more. The plasma process may be performed at a process temperature of 250° C. or more, and preferably of 250° C. or more and 900° C. or less.

A transistor is preferably manufactured as a semiconductor device. The metal layer is preferably a tungsten layer or tungsten silicide layer.

According to a fourth aspect of the present invention, there is provided a control program for execution on a computer, used for a plasma processing apparatus including a planar antenna with a plurality of slots formed therein, by which microwaves are supplied into a process chamber to generate plasma, wherein the control program, when executed by the computer, controls the apparatus to perform a plasma oxidation method, by use of a process gas containing hydrogen gas and oxygen gas, on a laminated structure, which includes at least a poly-silicon layer and a metal layer containing a refractory metal as a main component, thereby preferentially oxidizing the poly-silicon layer by plasma.

According to a fifth aspect of the present invention, there is provided a computer storage medium that stores a control program for execution on a computer, used for a plasma processing apparatus including a planar antenna with a plurality of slots formed therein, by which microwaves are supplied into a process chamber to generate plasma, wherein the control program, when executed by the computer, controls the apparatus to perform a plasma oxidation method, by use of a process gas containing hydrogen gas and oxygen gas, on a laminated structure, which includes at least a poly-silicon layer and a metal layer containing a refractory metal as a main component, thereby preferentially oxidizing the poly-silicon layer by plasma.

According to a sixth aspect of the present invention, there is provided a plasma processing apparatus comprising:

a process chamber configured to be vacuum-exhausted and to process a target object by plasma;

a plasma supply source including a planar antenna with a plurality of slots formed therein, by which microwaves are supplied into the process chamber to generate plasma; and a control section that exercises control to perform a plasma oxidation method, by use of a process gas containing hydrogen gas and oxygen gas, on a laminated structure, which includes at least a poly-silicon layer and a metal layer containing a refractory metal as a main component, thereby preferentially oxidizing the poly-silicon layer by plasma within the process chamber.

According to a seventh aspect of the present invention, there is provided a semiconductor device manufacturing method performed on a laminated structure, which includes at least a poly-silicon layer and a metal layer containing a refractory metal as a main component, the method comprising:

subjecting the laminated structure to a plasma process by use of a process gas containing hydrogen gas, oxygen gas, and a rare gas, thereby forming an oxide film on the poly-silicon layer, within a plasma processing apparatus in which microwaves are supplied into a process chamber to generate plasma.

The process gas is supplied such that a flow rate ratio of hydrogen gas relative to oxygen gas is preferably 1.5 or more, more preferably 2 or more, and furthermore preferably 8 or more.

The process gas is supplied such that a flow rate ratio of the rare gas relative to hydrogen gas is preferably 1.25 to 10.

The plasma process may be performed at a process temperature of 250° C. or more, and preferably of 250° C. or more and 900° C. or less.

According to the present invention, where an re-oxidation process is performed on a poly-silicon layer in a plasma processing apparatus of the RLSA type, hydrogen gas is supplied simultaneously with oxygen gas at a predetermined ratio to control a reducing atmosphere inside a process chamber. Consequently, it is possible to perform selective oxidation to preferentially oxidizing silicon without oxidizing tungsten even at a temperature of 300° C. or more.

Particularly, where a flow rate ratio of hydrogen gas relative to oxygen gas (which may be referred to as "$H_2/O_2$ ratio" hereinafter) is set to be 8 or more, not only tungsten oxidation is prevented, but also tungsten contamination at atomic level is significantly reduced. Consequently, it is possible to stabilize the quality of a semiconductor product while preventing ill effects from being caused on the product.

Further, since tungsten contamination is reduced or suppressed, the interior of the chamber is maintained in a clean state. In this case, even where a re-oxidation process is repeatedly performed in the same chamber, it is possible to suppress a decrease in oxide film thickness, which is an inherent problem of re-oxidation processes performed by plasma processing apparatuses of the RLSA type.

Further, according to the present invention, it is possible to obtain the following advantages by use of a plasma processing apparatus of the RLSA type, as compared to a plasma processing apparatus of another type (for example, a plasma processing apparatus of the parallel-plate type or magnetron type.

Specifically, where a plasma processing apparatus of the RLSA type is used, plasma is generated with a high density and a low electron temperature, so an oxide film can be formed with higher quality and fewer damages, as compared to another plasma processing apparatus. Accordingly, an oxide film thus formed on a poly-silicon layer sidewall has quality much better than that of an oxide film formed by thermal oxidation processes. For example, even where the process is performed at a low temperature of about 400° C., the property concerning leakage current becomes better than that obtained by thermal oxidation processes.

BEST MODE FOR CARRYING OUT THE INVENTION

Preferable embodiments of the present invention will now be described with reference to the accompanying drawings.

Figure 1:
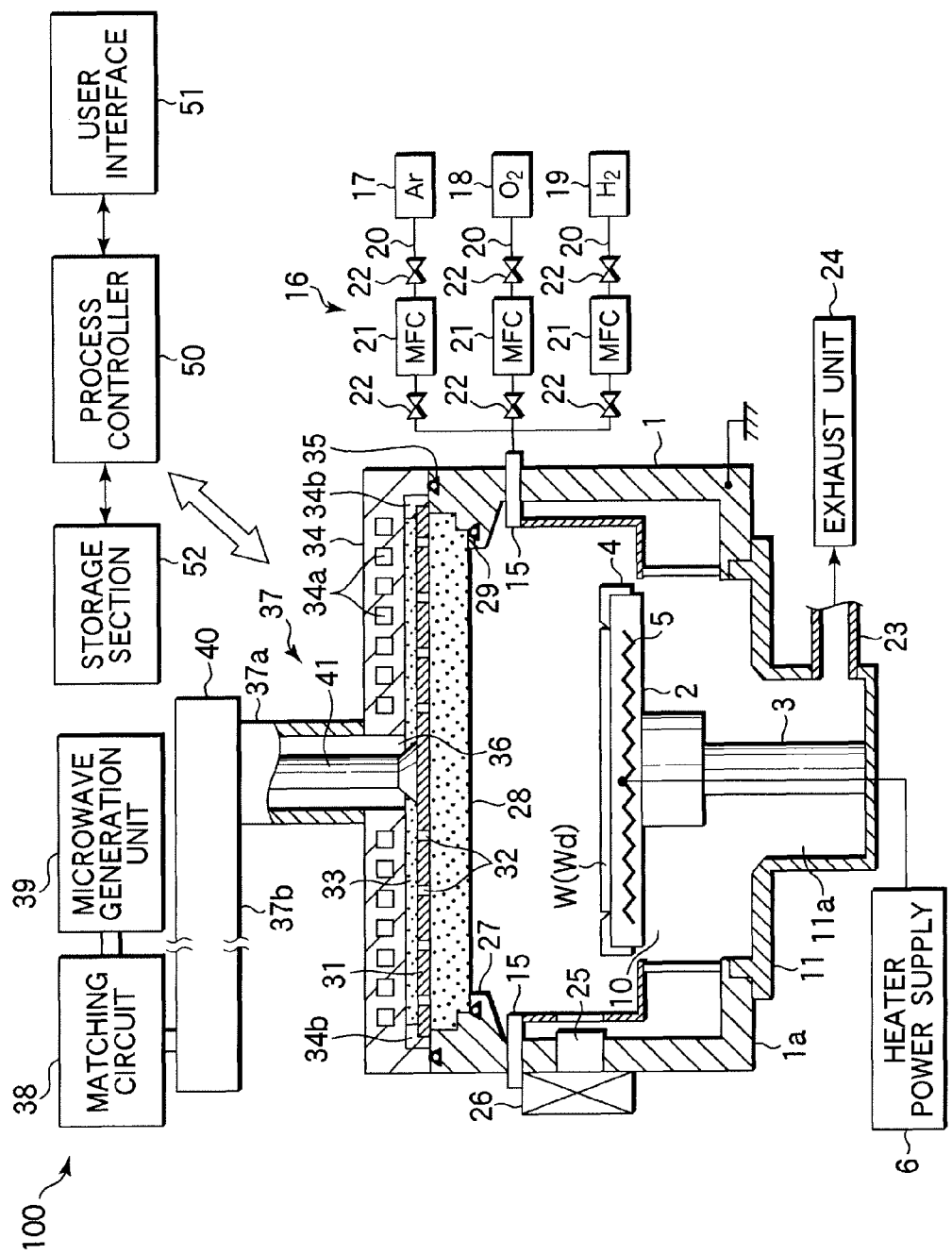
FIG. 1 This is a sectional view schematically showing an example of a plasma processing apparatus suitable for performing a method according to the present invention.

FIG. 1 is a sectional view schematically showing an example of a plasma processing apparatus suitable for performing a plasma oxidation method according to the present invention. This plasma processing apparatus utilizes an RLSA (Radial Line Slot Antenna) plasma generation technique, in which microwaves are supplied from a planar antenna having a plurality of slots into a process chamber to generate plasma, so that microwave plasma is generated with a high density and a low electron temperature.

This plasma processing apparatus 100 can proceed with a plasma process at a low temperature of 600° C. or less and free from damage to the underlying film and so forth. Further, this apparatus can provide high density plasma with good plasma uniformity to realize process uniformity comparable to those attained by diffusion furnaces. Accordingly, the plasma oxidation processing apparatus 100 suits for a re-oxidation process of a poly-silicon layer included in a gate electrode.

This plasma processing apparatus 100 includes an essentially cylindrical chamber 1, which is airtight and grounded. The bottom wall 1a of the chamber 1 has a circular opening 10 formed essentially at the center, and is provided with an exhaust pit 11 communicating with the opening 10 and extending downward.

The chamber 1 is provided with a susceptor 2 located therein and made of a ceramic, such as AlN, for supporting a target substrate, such as a wafer W or dummy wafer Wd, in a horizontal state. The susceptor 2 is supported by a cylindrical support member 3 made of a ceramic, such as AlN, and extending upward from the center of the bottom of the exhaust pit 11. The susceptor 2 is provided with a guide ring 4 located on the outer edge to guide the wafer W. The susceptor 2 is further provided with a heater 5 of the resistance heating type built therein. The heater 5 is supplied with a power from a heater power supply 6 to heat the susceptor 2, thereby heating the target object or wafer W. For example, the heater 5 can control the temperature within a range of from about room temperature to 900° C. A cylindrical liner 7 made of quartz is attached along the inner wall of the chamber 1.

The susceptor 2 is provided with wafer support pins (not shown) that can project and retreat relative to the surface of the susceptor 2 to support the wafer W and move it up and down.

A gas feed member 15 having an annular structure is attached in the sidewall of the chamber 1, and is connected to a gas supply system 16. The gas feed member may have a shower structure. The gas supply system 16 includes an Ar gas supply source 17, an $H_2$ gas supply source 18, and an $O_2$ gas supply source 19, from which gases are supplied through respective gas lines 20 to the gas feed member 15 and are delivered from the gas feed member 15 into the chamber 1. Each of the gas lines 20 is provided with a mass-flow controller 21 and two open/close valves 22 one on either side of the controller 21.

The sidewall of the exhaust pit 11 is connected to an exhaust unit 24 including a high speed vacuum pump through an exhaust line 23. The exhaust unit 24 can be operated to uniformly exhaust the gas from inside the chamber 1 into the space 11a of the exhaust pit 11, and then out of the exhaust pit 11 through the exhaust line 23. Consequently, the inner pressure of the chamber 1 can be decreased at a high speed to a predetermined vacuum level, such as 0.133 Pa.

The chamber 1 has a transfer port 25 formed in the sidewall and provided with a gate valve 26 for opening/closing the transfer port 25. The wafer W or dummy wafer Wd is transferred between the plasma processing apparatus 100 and an adjacent transfer chamber (not shown) through the transfer port 25.

The top of the chamber 1 is opened and is provided with an annular support portion 27 along the periphery of the opening. A microwave transmission plate 28 is airtightly mounted on the support portion 27 through a seal member 29. The microwave transmission plate 28 is made of a dielectric material, such as quartz or a ceramic, e.g., $Al_2O_3$, to transmit microwaves. The interior of the chamber 1 is thus held airtight.

Figure 2:
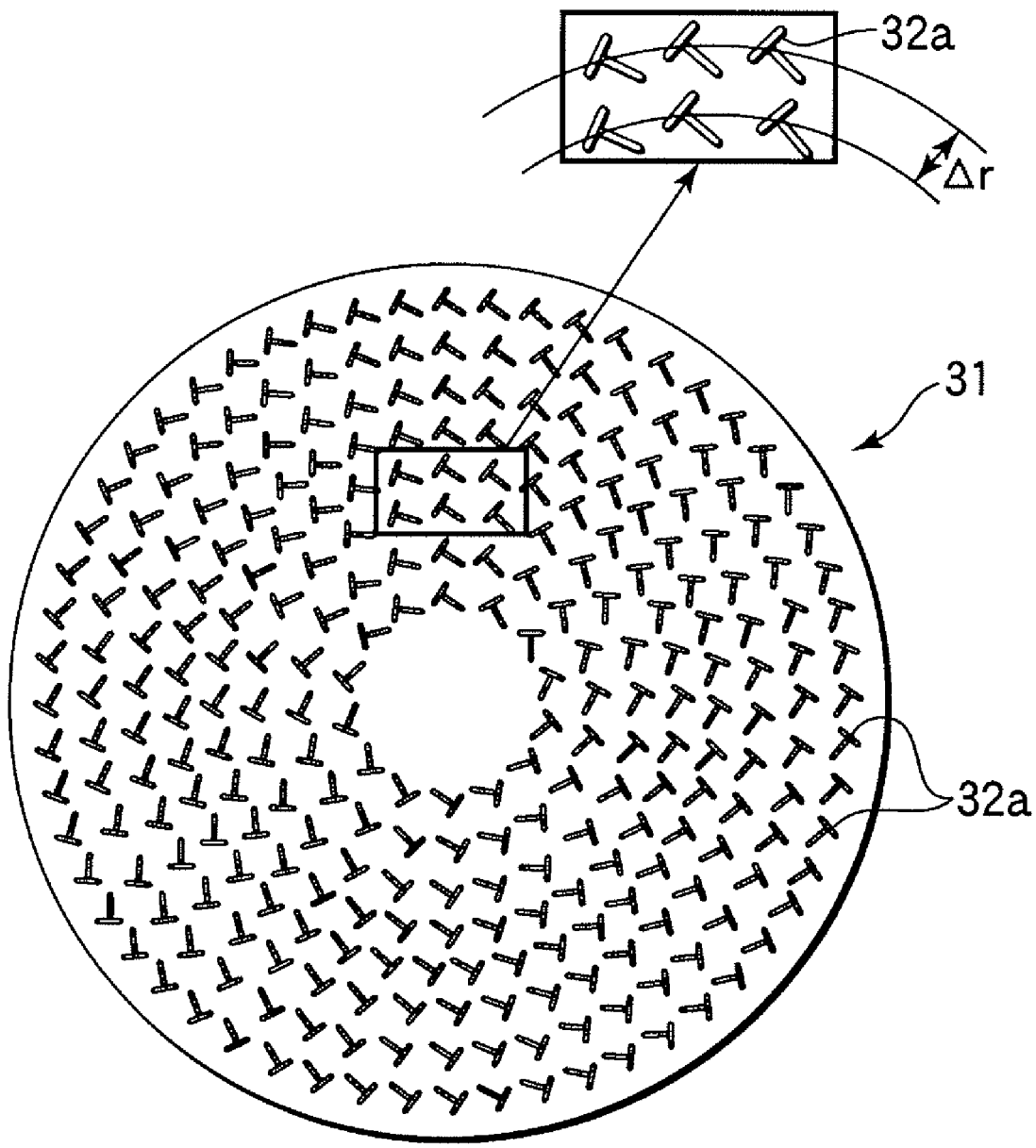
FIG. 2 This is a view showing the structure of a planar antenna member.

A circular planar antenna member 31 is located above the microwave transmission plate 28 to face the susceptor 2. The planar antenna member 31 is mounted on the microwave transmission plate 28, and a slow-wave material 33 is further disposed to cover the top of the planar antenna member 31. The planar antenna member 31 and slow-wave material 33 are fixed at the periphery by a presser member 34b. A shield lid 34 is disposed to cover the slow-wave material 33, and is supported on the upper end of the sidewall of the chamber 1. The planar antenna member 31 is a circular plate made of a conductive material, and is formed to have, e.g., a diameter of 300 to 400 mm and a thickness of 1 to several mm (for example, 5 mm) for 8-inch wafers W. Specifically, the planar antenna member 31 is formed of, e.g., a copper plate or aluminum plate with the surface plated with gold. The planar antenna member 31 has a number of microwave radiation holes 32 penetrating therethrough and formed in a predetermined pattern. For example, as shown in FIG. 2, the microwave radiation holes 32 are formed of long grooves or slots 32a, wherein the slots 32a may be arranged such that adjacent slots 32a intersect with each other to form a T-shape, and they are arrayed concentrically. The length and array intervals of the slots 32a are determined in accordance with the wavelength of radio frequency generated by a microwave generation unit 39. The microwave radiation holes 32 (slots 32a) may have another shape, such as through holes of a circular shape. The array pattern of the microwave radiation holes 32 (slots 32a) is not limited to a specific one, and, for example, it may be spiral or radial other than concentric.

The slow-wave material 33 is made of a dielectric material with a dielectric constant larger than that of vacuum, and is located on the top of the planar antenna member 31. The planar antenna member 31 and slow-wave material 33 are covered with the shield lid 34 located at the top of the chamber 1 and made of a metal material, such as aluminum, stainless steel, or copper. A seal member 35 is interposed between the top of the chamber 1 and the shield lid 34 to seal this portion. The shield lid 34 is provided with a plurality of cooling water passages 34a, 34a, . . . , formed therein. A cooling water is supplied to flow through the cooling water passages and thereby cool the planar antenna member 31, microwave transmission plate 28, slow-wave material 33, and shield lid 34. Consequently, these members are prevented from being damaged by the heat of plasma, while plasma is stably maintained. The shield lid 34 is grounded.

The shield lid 34 has an opening 36 formed at the center of the upper wall and connected to a wave guide tube 37. The wave guide tube 37 is connected to a microwave generation unit 39 at one end through a matching circuit 38. The microwave generation unit 39 generates microwaves with a frequency of, e.g., 2.45 GHz, which are transmitted through the wave guide tube 37 to the planar antenna member 31. The microwaves may have a frequency of 8.35 GHz or 1.98 GHz.

The wave guide tube 37 includes a coaxial wave guide tube 37a having a circular cross-section and extending upward from the opening 36 of the shield lid 34, and a rectangular wave guide tube 37b connected to the upper end of the coaxial wave guide tube 37a and extending in a horizontal direction. The rectangular wave guide tube 37b includes a mode transducer 40 at the end connected to the coaxial wave guide tube 37a. The coaxial wave guide tube 37a includes an inner conductive body 41 extending at the center, which is connected and fixed to the center of the planar antenna member 31 at the lower end. Microwaves are efficiently propagated through the inner conductive body of the coaxial wave guide tube 37a to the planar antenna member 31.

The respective components of the plasma processing apparatus 100 are connected to and controlled by a process controller 50. The process controller 50 is connected to a user interface 51 including, e.g. a keyboard and a display, wherein the keyboard is used for a process operator to input commands for operating the plasma processing apparatus 100, and the display is used for showing visualized images of the operational status of the plasma processing apparatus 100.

Further, the process controller 50 is connected to a storage section 52 that stores recipes containing control programs, process condition data, and so forth recorded therein, for the process controller 50 to control the plasma processing apparatus 100 so as to perform various processes.

A required recipe is retrieved from the storage section 52 and executed by the process controller 50 in accordance with an instruction or the like input through the user interface 51. Consequently, the plasma processing apparatus 100 can perform a predetermined process under the control of the process controller 50. The recipes containing control programs and process condition data may be used while they are stored in a computer readable storage medium, such as a CD-ROM, hard disk, flexible disk, or flash memory. Alternatively, the recipes may be used online while they are transmitted from another apparatus through, e.g., a dedicated line, as needed.

Figure 3A:
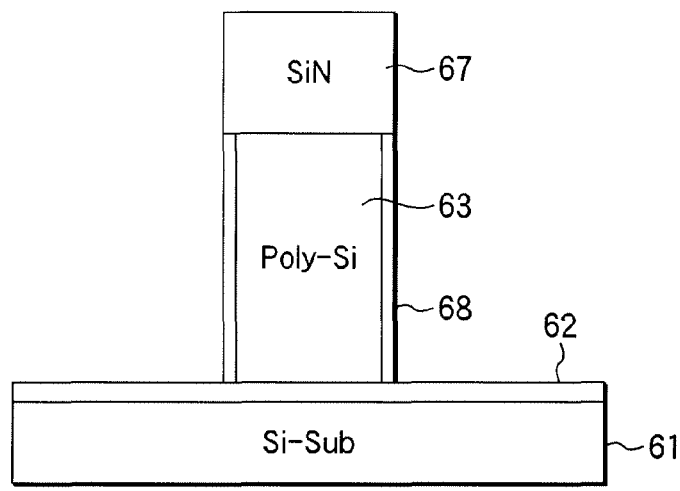
FIG. 3A This is a view schematically showing the structure of a conventional gate electrode made of poly-silicon.
Figure 3B:
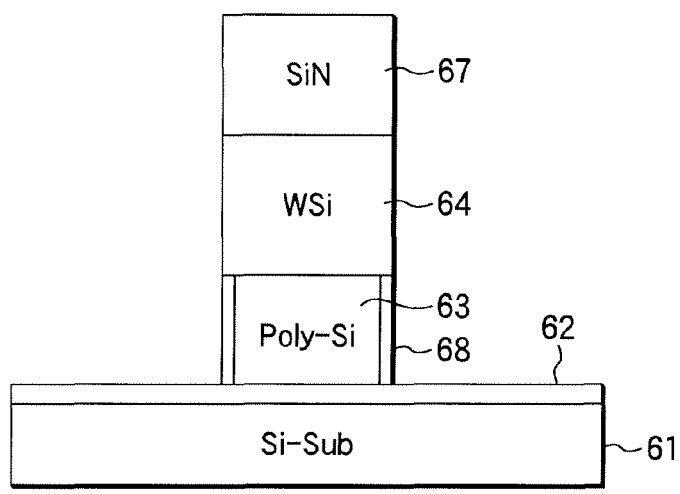
FIG. 3B This is a view showing an example of the structure of a gate electrode including a W-containing film in relation to an embodiment of the present invention.
Figure 3C:
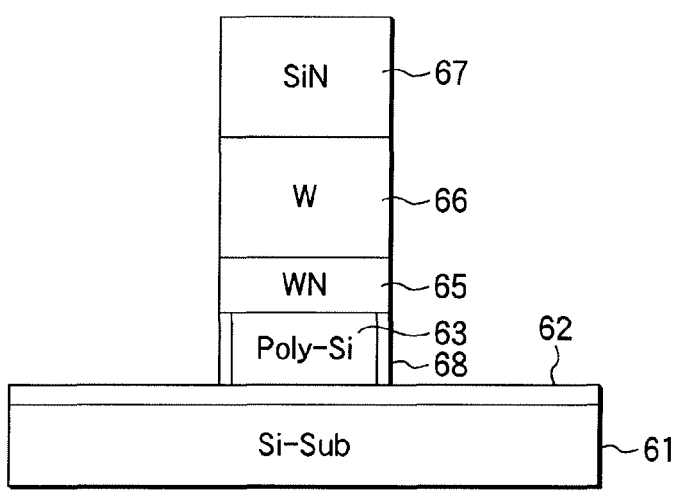
FIG. 3C This is a view showing another example of the structure of a gate electrode including a W-containing film in relation to an embodiment of the present invention.

In the plasma processing apparatus of the RLSA type 100 thus arranged, a selective oxidation process of a gate electrode is performed, as described above. Conventionally, as shown in FIG. 3A, a structure used as a gate electrode comprises a poly-silicon layer 63 formed on a silicon wafer or Si substrate 61 through a gate insulating film 62. However, owing to the demands for higher integration degrees and higher operation speeds of LSIs, design rules are miniaturized, so sidewall oxidation of gate electrodes is required to be controlled more accurately, and the resistivity of gate electrodes is required to be lower. Accordingly, in recent years, gates with a structure utilizing tungsten (W) are often employed. One of the examples is a tungsten polycide structure shown in FIG. 3B, which comprises a poly-silicon layer 63 formed on an Si substrate 61 through a gate insulating film 62 and a tungsten silicide (WSi) layer 64 formed on the poly-silicon layer 63. Another example used for high speed devices is a tungsten poly-metal gate structure with a lower resistivity shown in FIG. 3C, which comprises a poly-silicon layer 63 formed on an Si substrate 61 through a gate insulating film 62, and a barrier layer 65 of tungsten nitride (WN) and a tungsten (W) layer 66 sequentially formed on the poly-silicon layer 63. In FIGS. 3A to 3C, a reference symbol 67 denotes a hard mask layer made of, e.g., silicon nitride (SiN) and used in etching the gate electrode, and a reference symbol 68 denotes an oxide film formed by the selective oxidation.

When a selective oxidation process of a gate electrode is performed in the plasma processing apparatus 100, the gate valve 26 is first opened, and a wafer W having the gate electrode formed thereon is transferred through the transfer port 25 into the chamber 1 and placed on the susceptor 2.

Then, Ar gas, $H_2$ gas, and $O_2$ gas are supplied at predetermined flow rates from the Ar gas supply source 17, $H_2$ gas supply source 18, and $O_2$ gas supply source 19 in the gas supply system 16 through the gas feed member 15 into the chamber 1, while it is maintained at a predetermined pressure. As conditions used at this time, the flow rate is preferably set such that, e.g., Ar gas: 100 to 3,000 mL/min, $H_2$ gas: 10 to 1,000 mL/min, and $O_2$ gas: 10 to 1,000 mL/min. In order to set a high $H_2$ gas concentration, the flow rate ratio of $H_2/O_2$ is preferably set to be 1 or more and 12 or less. In this case, the pressure inside the chamber is preferably set to be 3 to 700 Pa. The temperature inside the chamber is preferably set to be 100 to 900° C. The microwave power is preferably set to be 1,500 to 5,000 W. With these conditions, the reaction of poly-silicon oxidation is controlled with high accuracy, while tungsten oxidation is suppressed by hydrogen radicals. Further, where the temperature is 300° C. or more, the flow rate ratio of $H_2/O_2$ is preferably set to be 8 or more.

On the other hand, the flow rate ratio of Ar gas relative to $H_2$ gas, i.e., $Ar/H_2$, is preferably selected from a range of 1 to 20, and more preferably of 1.25 to 10.

Then, microwaves are supplied from the microwave generation unit 39 through the matching circuit 38 into the wave guide tube 37. The microwaves are supplied through the rectangular wave guide tube 37b, mode transducer 40, and coaxial wave guide tube 37a in this order to the planar antenna member 31. Then, the microwaves are radiated from the planar antenna member 31 through the microwave transmission plate 28 into the space above the wafer W within the chamber 1. The microwaves are propagated in a TE mode through the rectangular wave guide tube 37b, and are then transduced from the TE mode into a TEM mode by the mode transducer 40 and propagated in the TEM mode through the coaxial wave guide tube 37a to the planar antenna member 31.

When the microwaves are radiated from the planar antenna member 31 through the microwave transmission plate 28 into the chamber 1, an electromagnetic field is thereby formed inside the chamber 1. Consequently, $H_2$ gas, Ar gas, and $O_2$ gas are turned into plasma, by which the poly-silicon sidewall of the gate electrode formed on the wafer W is preferentially oxidized. Since microwaves are radiated from a number of slots 32a of the planar antenna member 31, this microwave plasma has a high plasma density of about $5\times10^{11}$ to $1\times10^{13}/cm^3$ or more, an electron temperature of about 0.7 to 2 eV, and a plasma density uniformity of ±5% or less. Accordingly, this plasma has merits such that a very thin oxide film can be formed by a selective oxidation process at a low temperature and in a short time, and the underlying film can suffer less plasma damage due to ions and so forth, so an oxide film of high quality can be formed.

Further, where a gate electrode containing tungsten (W) is formed, as shown in FIG. 3B or 3C, a selective oxidation process for poly-silicon is performed with such high density plasma in a short time at a low temperature, while using a gas blending of high $H_2/O_2$. In this case, the process can be performed with very high accuracy, while sublimation of $WO_x$ ($WO_3$, $WO_2$, or WO) due to oxidation of tungsten (W) is suppressed as far as possible. It is thought that hydrogen suppresses tungsten oxidation by a mechanism relying on reactions expressed by the following formulas (1) and (2). Accordingly, this plasma process is preferably performed by use of a value of $H_2/O_2$ ratio, with which the reaction proceeds to the formula (2), so that tungsten oxidation is suppressed. Further, this plasma process is preferably performed by use of a temperature and a flow rate ratio, with which the oxidation rate of poly-silicon exceeds a certain value.

$$W+3O^* \rightarrow WO_3 \qquad (1)$$

$$WO_3+3H^* \rightarrow W+3OH^* \qquad (2)$$

Figure 4A:
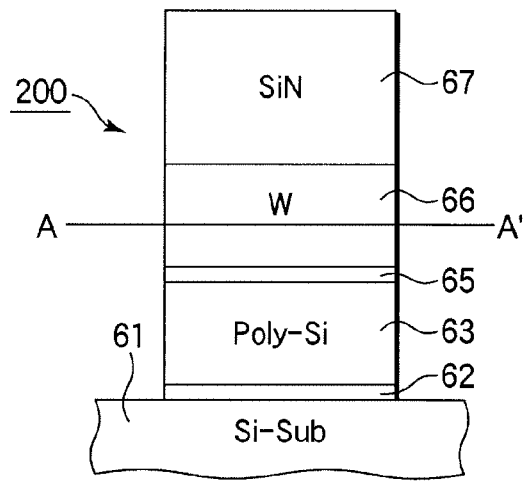
FIG. 4A This is a view schematically showing a gate electrode before a plasma oxidation process.
Figure 4B:
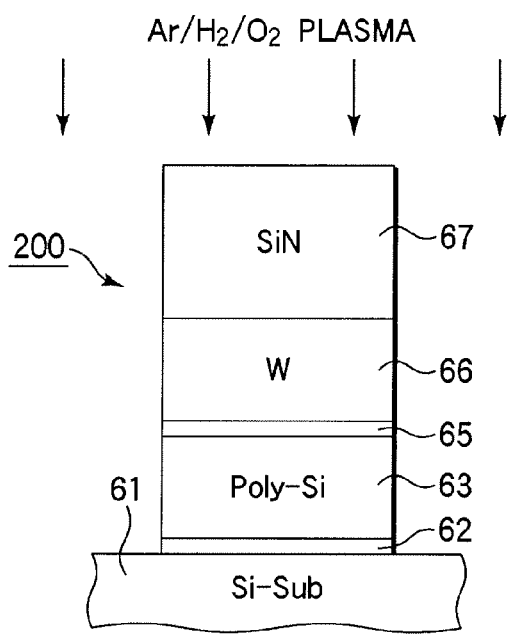
FIG. 4B This is a view schematically showing the gate electrode during the plasma oxidation process.
Figure 4C:
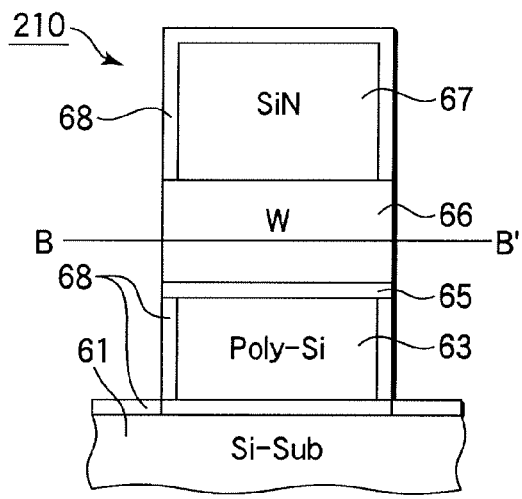
FIG. 4C This is a view schematically showing the gate electrode after the plasma oxidation process.

Next, an explanation will be given of steps for manufacturing a semiconductor device by a method according to the present invention. As an example, this explanation takes the gate electrode of a MOS transistor used for semiconductor devices, such as DRAMs and flash memories. FIGS. 4A to 4C schematically show a manner of an oxide film 68 being selectively formed on a gate electrode 200. FIG. 4A shows the gate electrode 200 after etching. A reference symbol 61 denotes an Si substrate.

In a fabrication sequence of the gate electrode 200, at first, a P+ or N+ well region (diffusion region (not shown)) doped with P type or N type dopant is formed in an Si substrate 61, and then a gate insulating film 62 ($SiO_2$) is formed by a thermal oxidation process or the like. A poly-silicon film is deposited on the gate insulating film 62 by CVD to form a poly-silicon layer 63. Further, a tungsten layer 66 is formed from tungsten, which is a high-melting point electrode material, on the poly-silicon layer 63, to decrease the resistivity of the gate electrode 200 to improve the operation speed. The tungsten layer 66 may be formed by use of, e.g., a CVD method or sputtering method. In place of the tungsten layer 66, tungsten silicide (WSi) may be used. Before the tungsten layer 66 is formed, a conductive barrier layer 65 is formed on the poly-silicon layer 63. The barrier layer 65 is used for preventing silicidation at the interface due to counter diffusion of W and Si, which brings about diffusion of WSi having a high resistivity. In this embodiment, the barrier layer 65 is made of tungsten nitride.

A hard mask layer 67 of silicon nitride and a photo-resist film (not shown) are formed in this order on the tungsten layer 66.

Thereafter, the hard mask layer 67 is etched by photolithography using the photo-resist film as a mask. Further, using the photo-resist film and hard mask layer 67 or the hard mask layer 67 as a mask, the tungsten layer 66, barrier layer 65, and poly-silicon layer 63 are sequentially etched to form the gate electrode 200. By this series of etching processes, sidewalls of the poly-silicon layer 63 and tungsten layer 66 are exposed on the side surface of the gate electrode 200. Further, a part of the gate insulating film 62 has been removed by etching.

As shown in FIG. 4B, the gate electrode 200 thus formed is then subjected to a plasma oxidation process in the plasma processing apparatus 100, while hydrogen gas and oxygen gas are controlled at a predetermined flow rate ratio. The plasma oxidation process is preferably performed under conditions, in which the gas flow rate is set such that, e.g., Ar gas: 1,000 mL/min, $H_2$ gas: 400 mL/min, and $O_2$ gas: 50 mL/min, and the pressure inside the chamber is set at 6.7 Pa (50 mTorr). With this plasma oxidation process, an oxide film 68 is preferentially formed on a surface of the poly-silicon layer 63. On the other hand, no oxide film is formed on the sidewalls of the tungsten layer 66 and barrier layer 65. Consequently, the gate electrode 210 is changed to the state shown in FIG. 4C. At this time, an oxide film is slightly formed on the Si substrate and SiN surface. Where the gate electrode includes another high-melting point material, such as one of molybdenum, tantalum, and titanium, and silicide, nitride, and alloy thereof, formed in place of the tungsten layer 66, the process may be performed in the same way.

Figure 5:
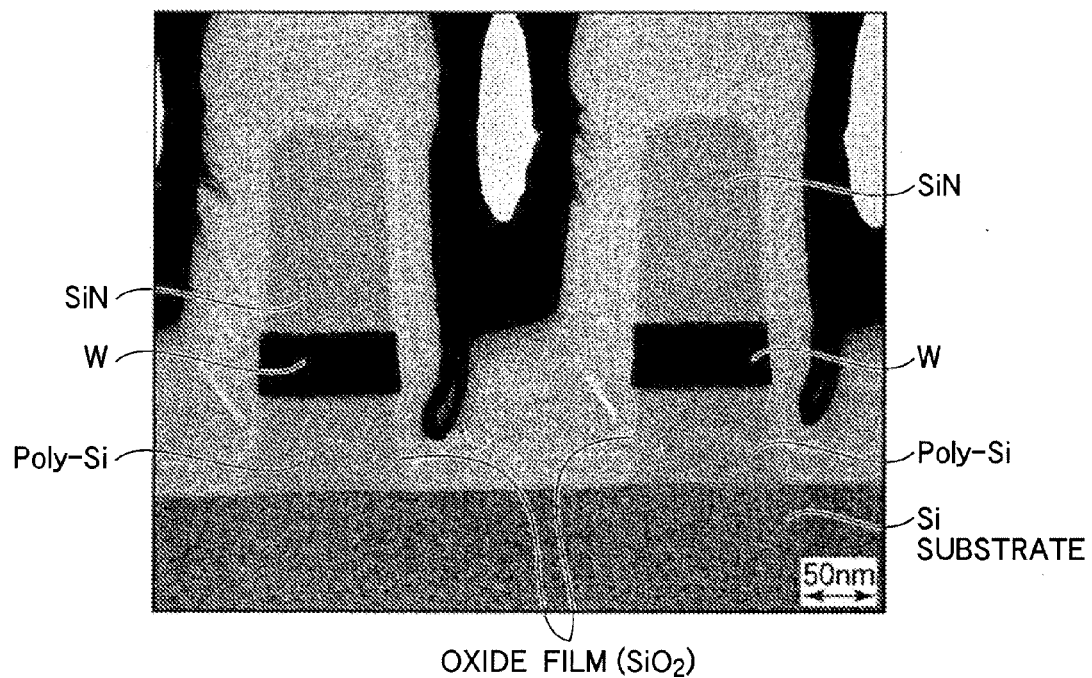
FIG. 5 This is a view showing a TEM picture of a cross-section of a gate electrode, where a plasma oxidation process was performed by use of addition of hydrogen gas.

FIG. 5 is a view showing a transmission electron microscope picture (TEM image) of a cross-sectional structure of the gate electrode 210 with the oxide film 68 formed on the sidewall in the plasma processing apparatus 100 shown in FIG. 1. For example, the gate electrode 210 has a height of about 250 nm (the thickness from the poly-silicon layer 63 to the hard mask layer 67). In this plasma oxidation process, the process gas flow rate was set at $Ar/H_2/O_2$=1,000/10/10 mL/min, the temperature of the Si substrate 61 at 250° C., the pressure at 133.3 Pa (1 Torr), the plasma application power at 3.5 kW, and the process time at 40 seconds.

Figure 6:
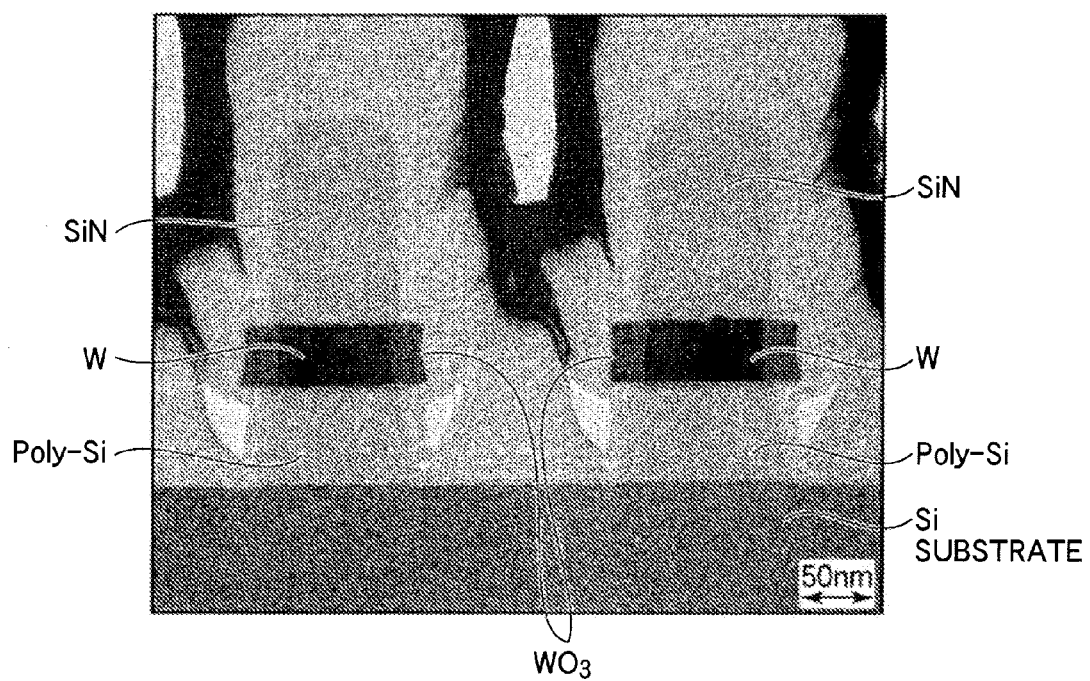
FIG. 6 This is a view showing a TEM picture of a cross-section of a gate electrode, where a plasma oxidation process was performed without addition of hydrogen gas.

FIG. 6 is a view showing a cross-sectional structure (TEM image) of a gate electrode with an oxide film formed thereon by oxidation using a process gas flow rate of $Ar/O_2$=1,000/10 mL/min, for comparison. In this plasma oxidation process, the temperature of the Si substrate 61 was set at 250° C., the pressure at 133.3 Pa (1 Torr), the plasma application power at 3.5 kW, and the process time at 120 seconds.

As in FIG. 4C, the gate electrode shown in each of FIGS. 5 and 6 has a structure including an Si substrate 61, on which a gate insulating film 62, a poly-silicon layer 63, a barrier layer 65 of tungsten nitride, a tungsten layer 66 (black layer), and a hard mask layer 67 of silicon nitride are laminated in this order. Since FIGS. 5 and 6 were originated from actual TEM images, the gate insulating film 62, oxide film 68, and barrier layer 65 are not shown clearly.

A comparison between FIGS. 5 and 6 reveals that, in the case of oxidation using argon gas and oxygen gas without hydrogen gas, the sidewall of the tungsten layer 66 was oxidized to be $WO_3$ and expanded in a lateral direction. Further, it is estimated that the Si substrate was contaminated with scattered tungsten.

On the other hand, in the case of a plasma process using an $H_2/O_2$ ratio of 1, as shown in FIG. 5, the tungsten layer 66 was scarcely oxidized, and thus was not expanded. Although not shown, in the case of a plasma process using an $H_2/O_2$ ratio of 8, even where the oxidation was performed at a temperature of 500° C. on the Si substrate, the tungsten layer 66 was less oxidized or expanded, as in FIG. 5. Accordingly, where the flow rate ratio of $H_2/O_2$ is set to be 1 or more and 20 or less, it is possible to perform selective oxidation for oxidizing the poly-silicon layer 63 without oxidizing the sidewall of the tungsten layer 66. Further, where the $H_2/O_2$ ratio is preferably set to be 4 or more, and more preferably to be 8 or more, a desirable plasma oxidation process can be performed to oxidize the exposed portion of the poly-silicon layer 63 while almost completely suppressing oxidation of the exposed portion of the tungsten layer 66.

Figure 7A:
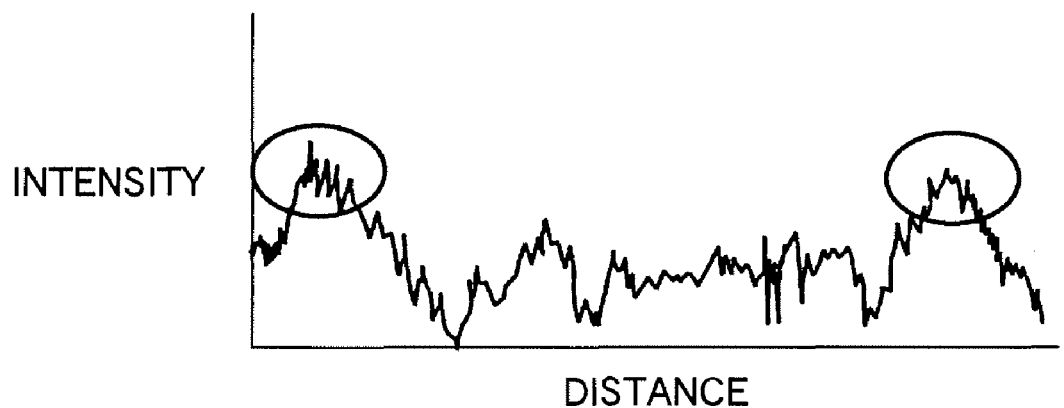
FIG. 7A This is a view showing an oxygen line profile in a tungsten layer measured by EELS before a plasma process.
Figure 7B:
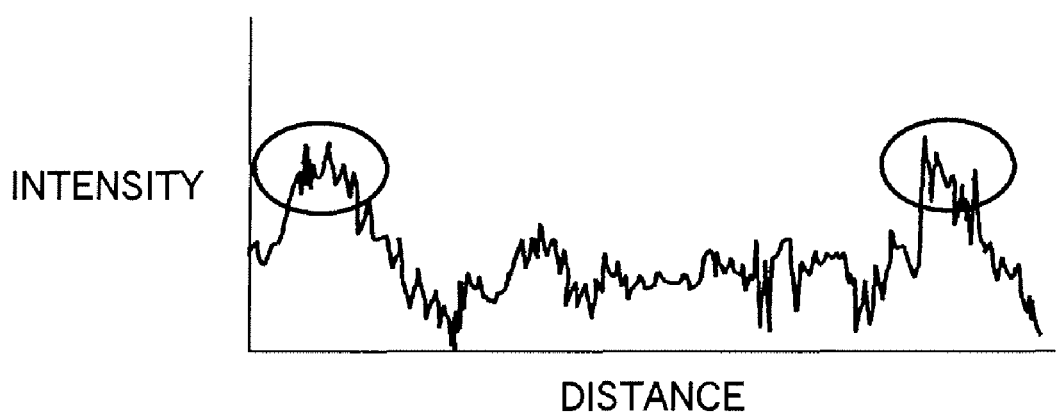
FIG. 7B This is a view showing an oxygen line profile in the tungsten layer measured by EELS after the plasma process.

FIGS. 7A and 7B are views showing changes in the tungsten layer 66 caused by the plasma oxidation process. FIG. 7A is a view showing an oxygen line profile before the plasma process, which is a result from an observation on the tungsten layer 66 along A-A' cross-section in FIG. 4A. FIG. 7B is a view showing an oxygen line profile after the plasma process, which is a result from an observation on the tungsten layer 66 along B-B' cross-section in FIG. 4C in the same manner. In the chart shown in each of FIGS. 7A and 7B, the vertical axis denotes luminescence intensity in proportion to the oxygen amount, and the horizontal axis denotes a normalized scale of the length (distance) of the A-A' cross-section or B-B' cross-section.

This plasma oxidation process was performed in the plasma processing apparatus 100 shown in FIG. 1, where the process gas flow rate was set at $Ar/H_2/O_2$=1,000110/10 mL/min, the temperature of the Si substrate 61 at 250° C., the pressure at 66.7133 Pa, the plasma application power at 3.5 kW, and the process time at 40 seconds. The oxygen line profile was measured by an electron energy loss spectroscopy method (EELS (Electron Energy Loss Spectroscopy) by use of Gatan Imaging Filter model 678 of GATAN Co. Ltd.)

A comparison between FIGS. 7A and 7B reveals that the oxygen line profile in the tungsten layer 66 scarcely differs between before and after the plasma oxidation process, and thus oxidation of the tungsten layer 66 is very slight.

Further, in relation to the gate electrode 210 according to this embodiment, the thickness of an oxide film formed on the side surface of the poly-silicon layer 63 was observed by a transmission electron microscope (TEM) before and after the plasma oxidation process. As a result, the oxide film thickness on the poly-silicon layer 63 at the side surface of the gate electrode was about 2.0 nm after wet cleaning performed subsequently to an etching process. On the other hand, the oxide film thickness on the poly-silicon layer 63 at the side surface of the gate electrode was about 3.3 nm after the plasma oxidation process. Accordingly, it has been confirmed that this embodiment allows an oxide film to be uniformly and preferentially formed on the poly-silicon layer 63.

As can be seen in these results, an oxide film is preferentially formed on the poly-silicon layer 63, while hardly any oxide film is formed on the tungsten layer 65. Further, the oxide film generation can be controlled by conditions, such as the process time and process temperature. As described above, when a plasma oxidation process is performed on the exposed side surface of the gate electrode 200 of an MOS transistor in the plasma processing apparatus 100, hydrogen gas is additionally supplied to set a $H_2/O_2$ ratio of 1 or more to perform the process within a reduction atmosphere. Consequently, it is possible to perform selective oxidation for oxidizing only poly-silicon without oxidizing tungsten.

Figure 8:
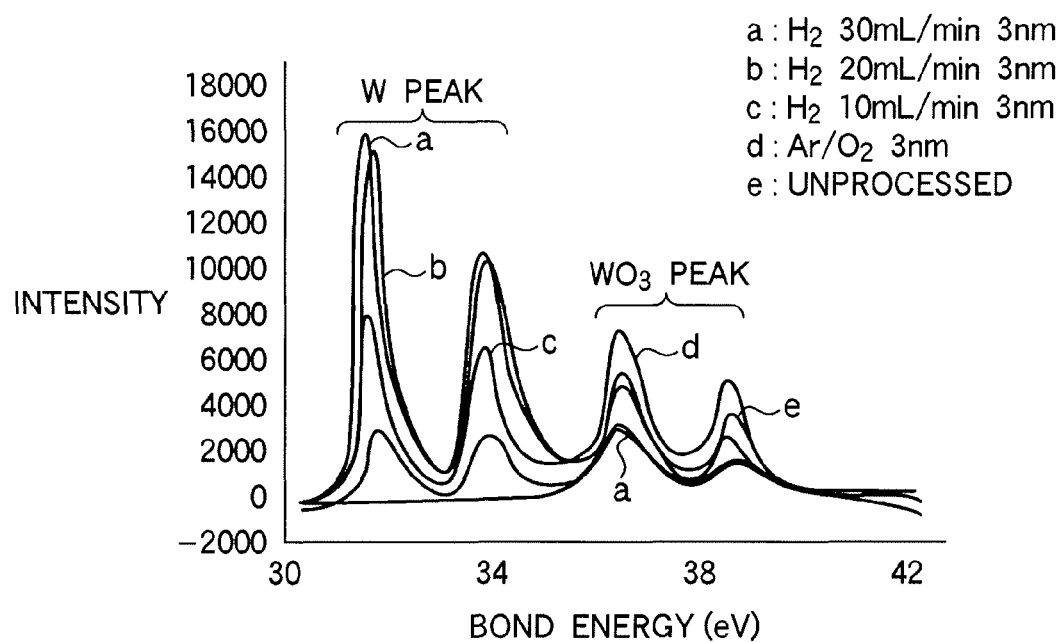
FIG. 8 This is a graph showing an oxidized level of tungsten measured by a surface analysis using an XPS apparatus, so as to show an effect of gas flow rate ratio.

FIG. 8 is a graph showing an oxidized level of tungsten measured by a surface analysis using an X-ray photoelectron spectroscopic apparatus (an XPS apparatus of Perkin-Elmer Co. Ltd), where the presence/absence of supply of hydrogen gas into the plasma processing apparatus 100 and the flow rate thereof were changed. In FIG. 8, the vertical axis denotes the peak intensity of W and $WO_3$, and the horizontal axis denotes bond strength. Further, in FIG. 8, symbols a, b, and c indicate results from cases where hydrogen gas was supplied at flow rates of 30, 20, and 10 mL/min, respectively. For comparison, a symbol d indicates a result from a case using only argon gas and oxygen gas, and a symbol e indicates a result from a case using no re-oxidation process, i.e., unprocessed case. In the cases a, b, c, and d, the thickness of an oxide film formed on an Si substrate was 3 nm. In this plasma oxidation process, the flow rates of argon gas and oxygen gas were fixed at 1,000 mL/min and 10 mL/min, respectively. The temperature of the Si substrate was set at 250° C., the pressure at 133.3 Pa, and the plasma application power at 3.5 kW. The process time was set at 66 seconds for a, 21 seconds for b, 21 seconds for c, and 30 seconds for d, respectively.

In these results, the intensity near 31 to 34 eV corresponding to the tungsten peak was higher with an increase in hydrogen gas flow rate. On the other hand, the intensity near 35 to 39 eV corresponding to the tungsten oxide peak was higher in the case (d) using no hydrogen gas and the unprocessed case (e). From these results, it has been found that, where hydrogen gas is supplied, tungsten oxidation becomes less likely caused, with an increase in the flow rate ratio of in hydrogen gas relative to oxygen gas.

Figure 9:
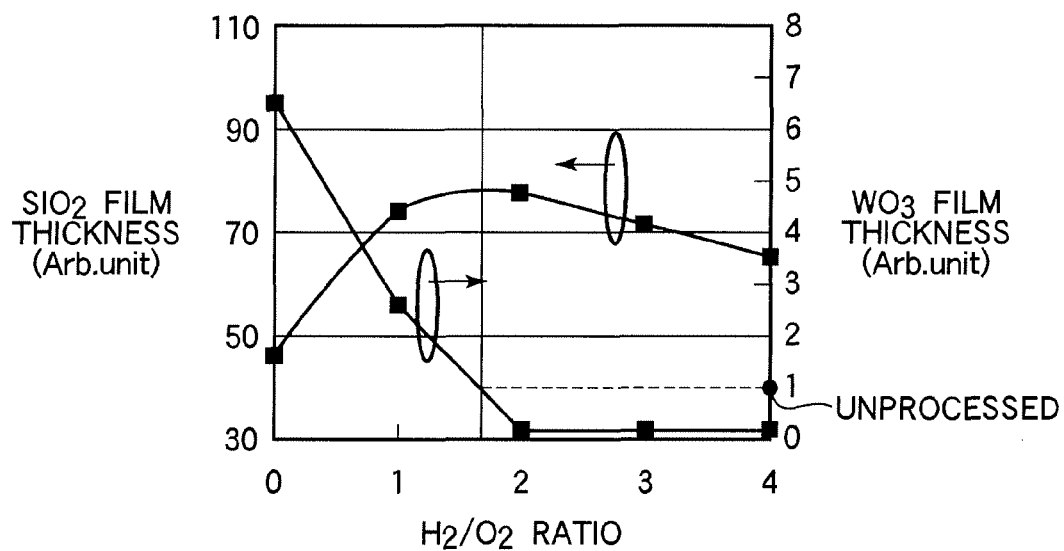
FIG. 9 This is a graph showing the relationship of $H_2/O_2$ ratio relative to silicon oxide film thickness and tungsten oxide film thickness.

FIG. 9 is a graph showing a result of measurement on the thickness of a silicon oxide film and a tungsten oxide film formed by a re-oxidation process in the plasma processing apparatus 100, while changing the $H_2/O_2$ ratio. In this process, the temperature of the Si substrate was set at 250° C., the oxygen gas flow rate at 100 mL/min, the pressure at 6.7 Pa, and the plasma application power at 2.2 kW. In the graph shown in FIG. 9, the vertical axis denotes the film thickness of a silicon oxide film ($SiO_2$) and a tungsten oxide film ($WO_3$) formed in the same process time, and the horizontal axis denotes the $H_2/O_2$ ratio.

As shown in FIG. 9, the silicon oxidation rate rapidly increases, then takes on the maximum value, and then gradually decreases, correspondingly to a range of the $H_2/O_2$ ratio of up to 1, from 1 to 2, and 2 or more, respectively. On the other hand, the thickness of the tungsten oxide film decreases with an increase in the supply amount of hydrogen gas, and essentially no $WO_3$ is formed in a range of the $H_2/O_2$ ratio of 2 or more. Further, the thickness of $WO_3$ film is smaller, as compared to the unprocessed case using no re-oxidation. Accordingly, it is thought that a reduction atmosphere due to hydrogen gas worked thereon.

As shown in FIGS. 8 and 9, where the plasma oxidation process is performed by use of supply of hydrogen gas in the plasma processing apparatus 100, tungsten oxidation can suppressed. Further, where the $H_2/O_2$ ratio is controlled, only silicon can be preferentially oxidized.

Further, it has been found that, in order to suppress tungsten oxidation, the $H_2/O_2$ ratio is preferably set to be 1.5 or more and 20 or less. The $H_2/O_2$ ratio is more preferably set to be 2 or more, and furthermore preferably set to be 4 or more, to almost completely suppress $WO_3$ generation. In order to maintain the silicon oxidation rate at a certain level or more, the $H_2/O_2$ ratio is preferably set to be 1 or more and 15 or less, and more preferably to be 1.5 or more and 15 or less.

As can be seen in these results described above, where selective re-oxidation for the poly-silicon layer is performed in the plasma processing apparatus 100, the $H_2/O_2$ ratio is preferably set as follows. Specifically, in order to suppress tungsten oxidation, the $H_2/O_2$ ratio is preferably set to be 1.5 or more and 20 or less, and more preferably to be 2 or more and 20 or less. Further, in light of the silicon oxidation rate, the $H_2/O_2$ ratio is preferably set to be 1 or more and 15 or less.

Figure 10:
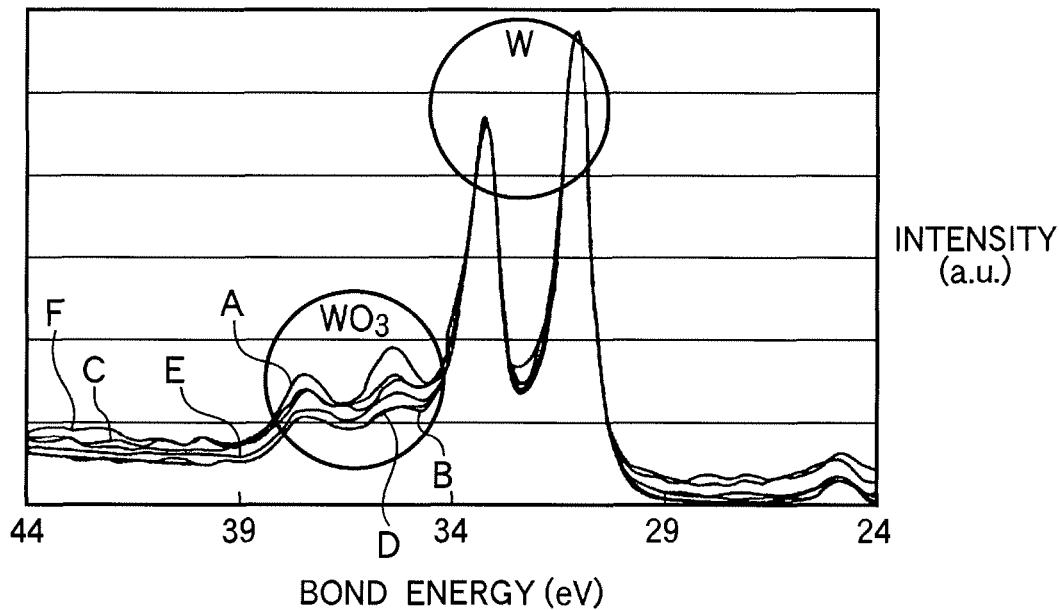
FIG. 10 This is a graph showing an oxidized level of tungsten measured by a surface analysis using an XPS apparatus, so as to show an effect of plasma process temperature.

FIG. 10 is a graph showing an oxidized level of tungsten measured by a surface analysis using an XPS apparatus as in FIG. 8, where a process for oxidizing the exposed poly-silicon surface of a gate electrode on an Si substrate was performed to form an oxide film having a thickness of 8 nm in the plasma processing apparatus 100, while the temperature condition was changed. In FIG. 10, a curved line A indicates an unprocessed state (using no re-oxidation), a curved line B indicates a case using a temperature of the Si substrate of 250° C., a curved line C indicates a case using a temperature of 300° C., a curved line D indicates a case using a temperature of 350° C., a curved line E indicates a case using a temperature of 400° C., and a curved line F indicates a case using a temperature of 600° C. In this experiment, the flow rate of $Ar/H_2/O_2$ was set at 1,000/200/10 mL/min, the pressure at 8.0 Pa, and the plasma application power at 2.2 kW.

As shown in FIG. 10, the peak intensity of $WO_3$ generated by tungsten oxidation was highest in the unprocessed state indicated by the curved line A. It has been found from this result that, where the plasma process is performed by use of supply of hydrogen gas and oxygen gas in the plasma processing apparatus 100, not only $WO_3$ generation is suppressed, but also tungsten oxide formed on the surface by natural oxidation during an etching process or thereafter is deoxidized. Further, where a method according to the present invention was utilized, tungsten oxidation was not caused even at a temperature in a range of 300° C. or more, such as 600° C., at which tungsten can be rapidly oxidized.

Figure 11:
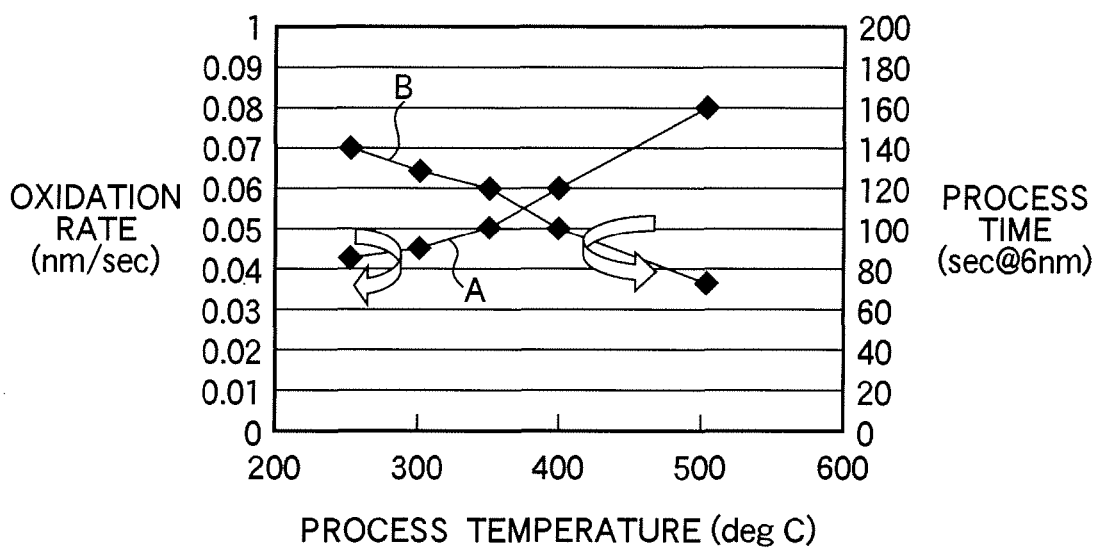
FIG. 11 This is a graph showing the relationship of the process temperature of a plasma process relative to the process time and silicon oxidation rate.

FIG. 11 is a graph plotting the silicon oxidation rate (reference symbol A) and process time (reference symbol B) with reference to the temperature of a Si substrate, where the Si substrate was oxidized to form an oxide film having a thickness of 6 nm in the plasma processing apparatus 100. In this process, the gas flow rate was set at $Ar/H_2/O_2$=1,000/200/100 mL/min, the pressure at 6.7 Pa, and the plasma application power at 2.2 kW. As shown in FIG. 11, as compared to the process using an Si substrate temperature of 250° C., the process using 500° C. rendered an oxidation rate twice larger. This means that, where the same oxidation amount is required, the process time is shorter with an in crease in temperature. As described above, where an oxide film of silicon is formed, a high temperature provides a better film quality, and the process temperature is preferably set to be 300° C. or more, and more preferably to be 500° C. or more.

Figure 12:
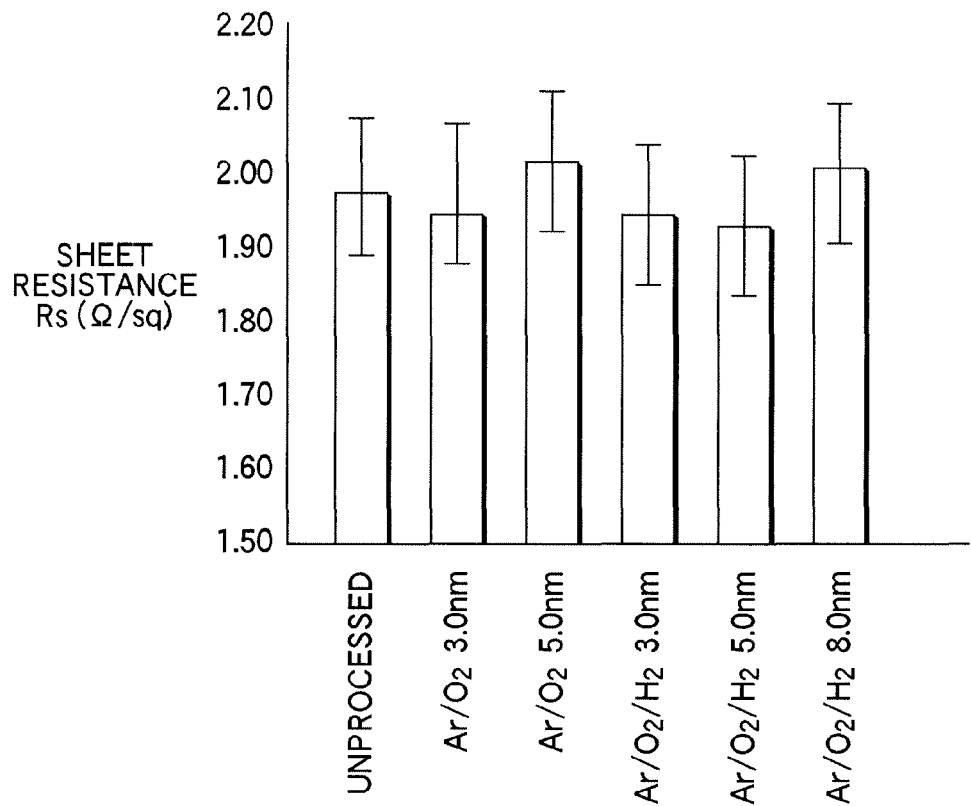
FIG. 12 This is a graph showing a result of measurement in terms of the sheet resistance of a tungsten thin film, with reference to gas compositions.

FIG. 12 is a graph showing a result of measurement in terms of the sheet resistance of a tungsten thin film on an Si substrate, after a re-oxidation process performed in the plasma processing apparatus 100. In this experiment, an examination was made on a change in the sheet resistance of a tungsten thin film, depending on the gas composition used in the plasma oxidation process. In FIG. 12, the vertical axis denotes the sheet resistance value with a unit of O/sq.

Further, in FIG. 12, the horizontal axis denotes experiment divisions. "$Ar/O_2$3.0 nm" indicates an experiment division in which the plasma oxidation process was performed by use of argon gas and oxygen gas as a process gas to form an oxide film having a thickness of 3 nm on an Si substrate. Similarly, "$Ar/O_2$5.0 nm" indicates an experiment division in which the plasma oxidation process was performed by use of argon gas and oxygen gas to form an oxide film having a thickness of 5 nm on an Si substrate.

Further, "$Ar/O_2/H_2$3.0 nm" indicates an experiment division in which the plasma oxidation process was performed by use of argon gas, oxygen gas, and hydrogen gas to form an oxide film having a thickness of 3 nm on an Si substrate. Similarly, "$Ar/O_2/H_2$5.0 nm" indicates an experiment division in which the plasma oxidation process was performed by use of argon gas, oxygen gas, and hydrogen gas to form an oxide film having a thickness of 5 nm on an Si substrate. Further, "$Ar/O_2/H_2$8.0 nm" indicates an experiment division in which the plasma oxidation process was performed by use of argon gas, oxygen gas, and hydrogen gas to form an oxide film having a thickness of 8 nm on an Si substrate.

For comparison, FIG. 12 also includes a result from an unprocessed case using no plasma oxidation process. In the plasma oxidation process, the process gas flow rate ratio was set at $Ar/O_2/H_2=1,000/10/10$ or $Ar/O_2=1,000/10$, the temperature of the Si substrate at 250° C., the pressure at 133.3 Pa, and the plasma application power at 3.5 kW. The process time was set at 30 seconds for "$Ar/O_2 3.0$ nm", 227 seconds for "$Ar/O_2 5.0$ nm", 21 seconds for "$Ar/H_2/O_2 3.0$ nm", 68 seconds for "$Ar/H_2/O_2 5.0$ nm", and 177 seconds for "$Ar/H_2/O_2 8.0$ nm".

As shown in FIG. 12, where the plasma oxidation process is performed by use of supply of hydrogen gas, the sheet resistance is decreased without reference to the thickness of an oxide film formed on the Si substrate. Accordingly, it has been confirmed that, where the process gas contains hydrogen gas mixed therein, a reduction effect works on the tungsten surface to effectively suppress oxidation thereof, thereby improving the performance of a gate electrode including this tungsten surface.

Figure 13:
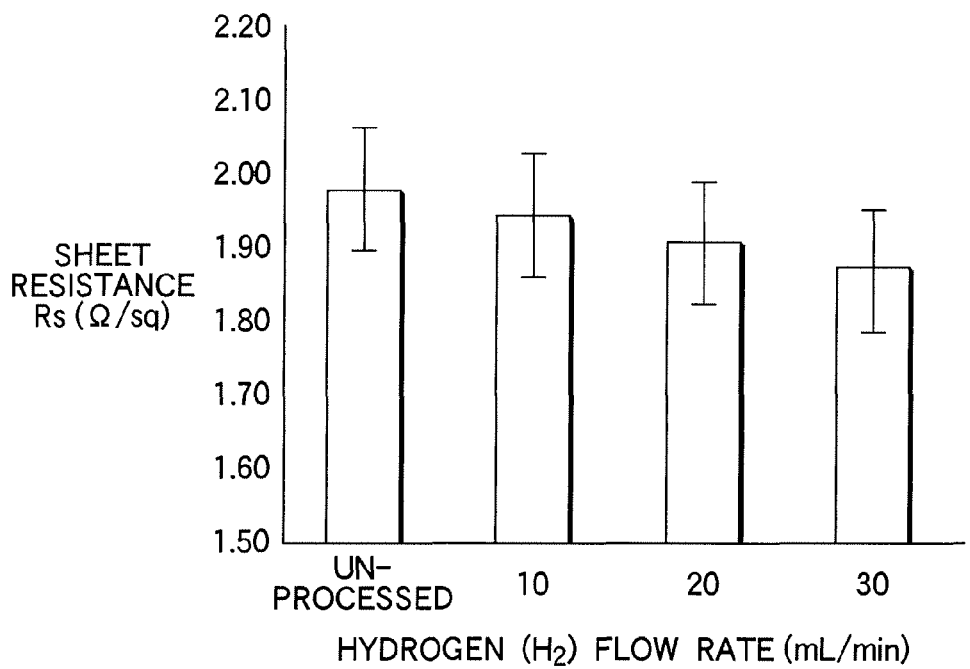
FIG. 13 This is a graph showing a result of measurement in terms of the sheet resistance of a tungsten thin film, with reference to $H_2$ flow rates.

FIG. 13 is a graph showing a result of measurement in terms of the sheet resistance of a tungsten thin film obtained by the same method used in FIG. 12, where an oxide film having a thickness of 3 nm was formed on an Si substrate in the plasma processing apparatus 100. In this plasma oxidation process, the hydrogen gas flow rate was set at different values of 10, 20, and 30 mL/min. The process gas flow rate ratio other than $H_2$ gas was set at $Ar/O_2=1,000/10$ mL/min. For comparison, FIG. 13 also includes the sheet resistance of a tungsten thin film formed by an unprocessed case using no plasma oxidation process. In the conditions of the plasma oxidation process, the temperature of the Si substrate was set at 250° C., the pressure at 133.3 Pa, and the plasma application power at 3.5 kW. The process time was set at 21 seconds for use of hydrogen gas at a flow rate of 10 mL/min, 21 seconds for 20 mL/min, and 66 seconds for 30 mL/min.

As shown in FIG. 13, with an in crease in hydrogen gas flow rate, the sheet resistance of the tungsten thin film is decreased. This is so, because oxidation of the tungsten thin film is suppressed by hydrogen gas being supplied. Further, it has been confirmed that, with an increase in $H_2/O_2$ ratio, the oxidation is suppressed and the sheet resistance is thereby decreased.

Figure 14:
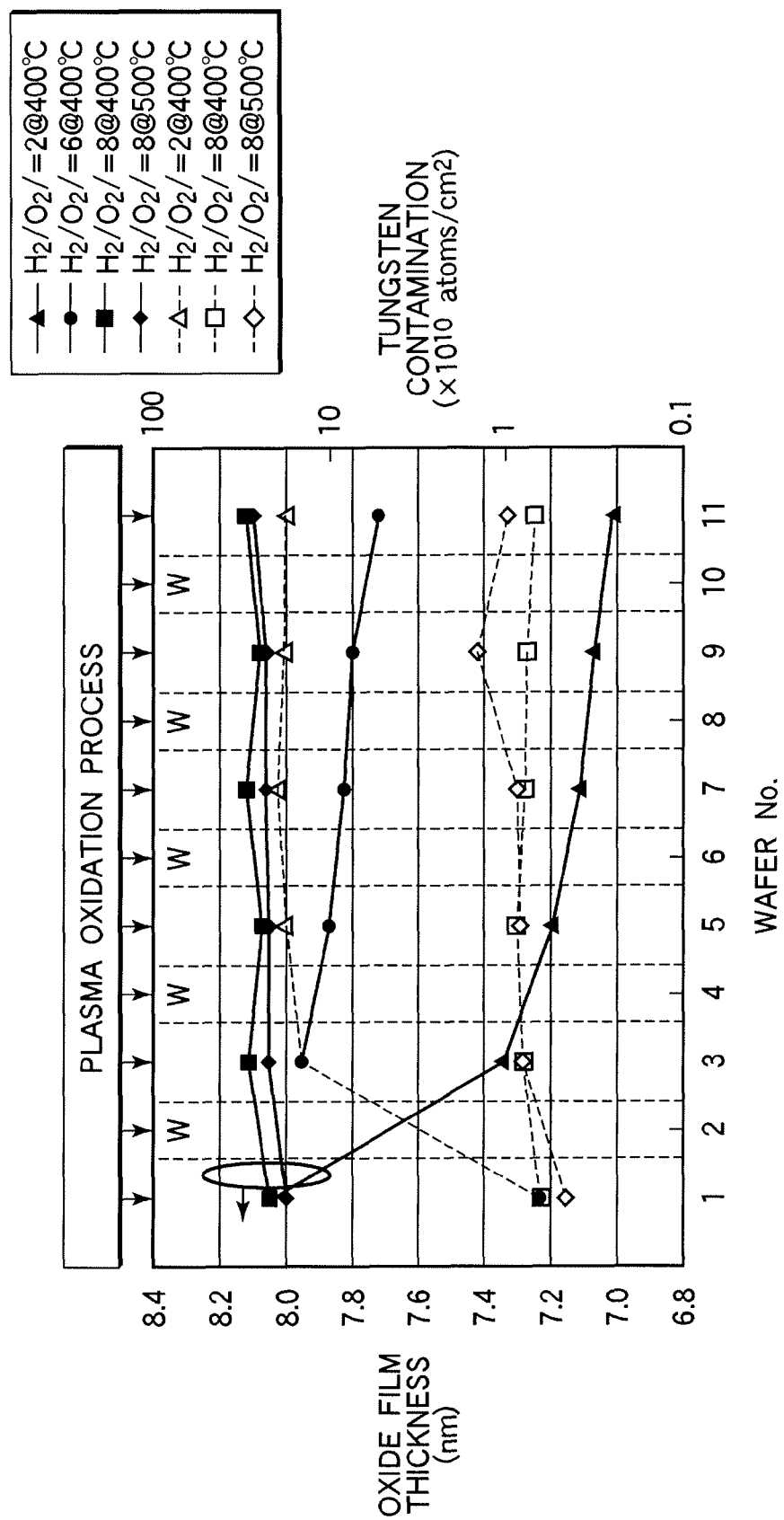
FIG. 14 This is a graph showing oxide film thickness and W concentration in a wafer surface, with reference to target wafer numbers.

FIG. 14 is a result of a running experiment set to form an oxide film having a thickness of 8 nm on an Si substrate, while a plasma process is performed with different values of the $H_2/O_2$ ratio and process temperature. In this experiment, the $H_2/O_2$ ratio was set at 2, 6, and 8, while the wafer temperature was set at 400° C. and 500° C.

At first, in the plasma processing apparatus 100 shown in FIG. 1, cleaning of the interior of the chamber was performed to obtain a tungsten free state. Then, a bare Si wafer (clean wafer) was placed on the susceptor, and seasoning of the interior of the chamber was performed under the conditions for the subsequent oxidation process.

Thereafter, a bare Si wafer used as the first wafer was placed on the susceptor, and an oxidation process was performed under the same conditions as that of a selective oxidation process for poly-silicon. In the conditions used at this time, the gas flow rate was set at $Ar/H_2/O_2=1,000/x/100$ mL/min while the x value was changed to 200, 600, and 800 ml/min. The pressure inside the chamber was set at 6.7 Pa, the microwave generation unit power at 3.4 kW, the wafer temperature at 400° C. and 500° C., and the process time at 110 seconds. The chamber wall temperature was 45° C. After the process, this first wafer was taken out, and the thickness of an oxide film and the tungsten concentration in the surface were measured. The film thickness was measured by an ellipsometer (Rudolph Co. Ltd.), and the tungsten concentration was measured by TXRF (total reflection fluorescent X-ray analysis by use of TREX610T of Technos Co. Ltd.).

Subsequently, a Si wafer used as the second wafer with a tungsten film formed on the surface was placed on the susceptor, and an oxidation process was performed under the same conditions. After the process, this wafer having the tungsten film was taken out. Then, a bare Si wafer used as the third wafer was placed on the susceptor, and an oxidation process was performed under the same conditions used for the first wafer. After the process, this third wafer was taken out, and the thickness of an oxide film and the tungsten concentration in the surface were measured. In the same way, from the fourth wafer, an oxidation process to be performed on a wafer having a tungsten film and an oxidation process to be performed on a bare Si wafer were repeated until the ordinal number of wafers reached eleventh, i.e., 11 wafers were processed in total. For each of the bare Si wafers, the film thickness and tungsten concentration were measured.

FIG. 14 shows a result from the series of these experiments. In FIG. 14, the horizontal axis denotes the wafer No. (i.e., the ordinal number), and the vertical axis denotes the thickness of the oxide film (angstrom) and the tungsten concentration in the wafer surface ($\times 10^{10}$ atoms/cm$^2$).

As can be seen in FIG. 14, where the process was performed with an $H_2/O_2$ ratio of 2 that could suppress tungsten oxidation, tungsten contamination was gradually increased with an increase in the number of processed wafers. Further, with an increase in tungsten contamination, the oxide film thickness was decreased.

It was also confirmed that, where the $H_2/O_2$ ratio was set at 6, the film thickness was decreased, but the decrease in film thickness was smaller as compared to the $H_2/O_2$ ratio of 2. In this respect, with an increase in the $H_2/O_2$ ratio, the decrease in film thickness was further smaller, and the decrease in film thickness was completely stopped where the $H_2/O_2$ ratio was set at 8. Further, where the $H_2/O_2$ ratio was set at 8, the tungsten concentration in the wafer surface was decreased to $1\times 10^{10}$ atoms/cm$^2$ or less. Furthermore, where the $H_2/O_2$ ratio was set at 8, a process temperature of 500° C. rendered the same result as that of 400° C. As regards the process temperature, a temperature not higher than 800° C. can be sufficiently usable for the process.

From the result shown in FIG. 14, it has been found that, in order to suppress tungsten oxidation and to prevent contamination at atomic level due to tungsten, the $H_2/O_2$ ratio in the process gas used for the plasma process is preferably set to be 8 or more. Further, in order to decrease the tungsten contamination, the plasma process temperature used for the $H_2/O_2$ ratio of 8 or more is preferably set to be 800° C. or less, and more preferably to be about 400 to 600° C. Consequently, it is possible to form a compact oxide film of high film quality and to improve the throughput, thereby increasing the process efficiency.

Judging from the data described above, it is thought that, in a plasma oxidation process of the RLSA type, a static reaction of oxidation-reduction takes place, due to a re-oxidation process by use of plasma, on the surface (exposed surface) of the tungsten layer of a gate electrode. Where the $H_2/O_2$ ratio is set to be 2 or more, tungsten oxidation is effectively suppressed, but, even in this case, it is estimated that an oxide WOx is slightly generated. The WOx thus generated may be scattered in the chamber and cause tungsten contamination at atomic level. However, with an increase in $H_2/O_2$ ratio, such as an $H_2/O_2$ ratio of 8 or more, preferably an $H_2/O_2$ ratio of 8 to 12, and more preferably an $H_2/O_2$ ratio of 8 to 10, it is possible to provide a strong reduction atmosphere. As a result, it is estimated that generation and/or scattering of WOx are suppressed, and the wafer contamination is thereby prevented. Since not only oxidation of the tungsten layer is suppressed, but also contamination at atomic level is suppressed, it is possible to prevent ill effects on semiconductor products due to tungsten contamination Further, since the tungsten contamination is prevented, it is possible to reliably suppress the decrease in oxide film thickness, which is an inherent problem of plasma processes of the RLSA type.

Figure 15:
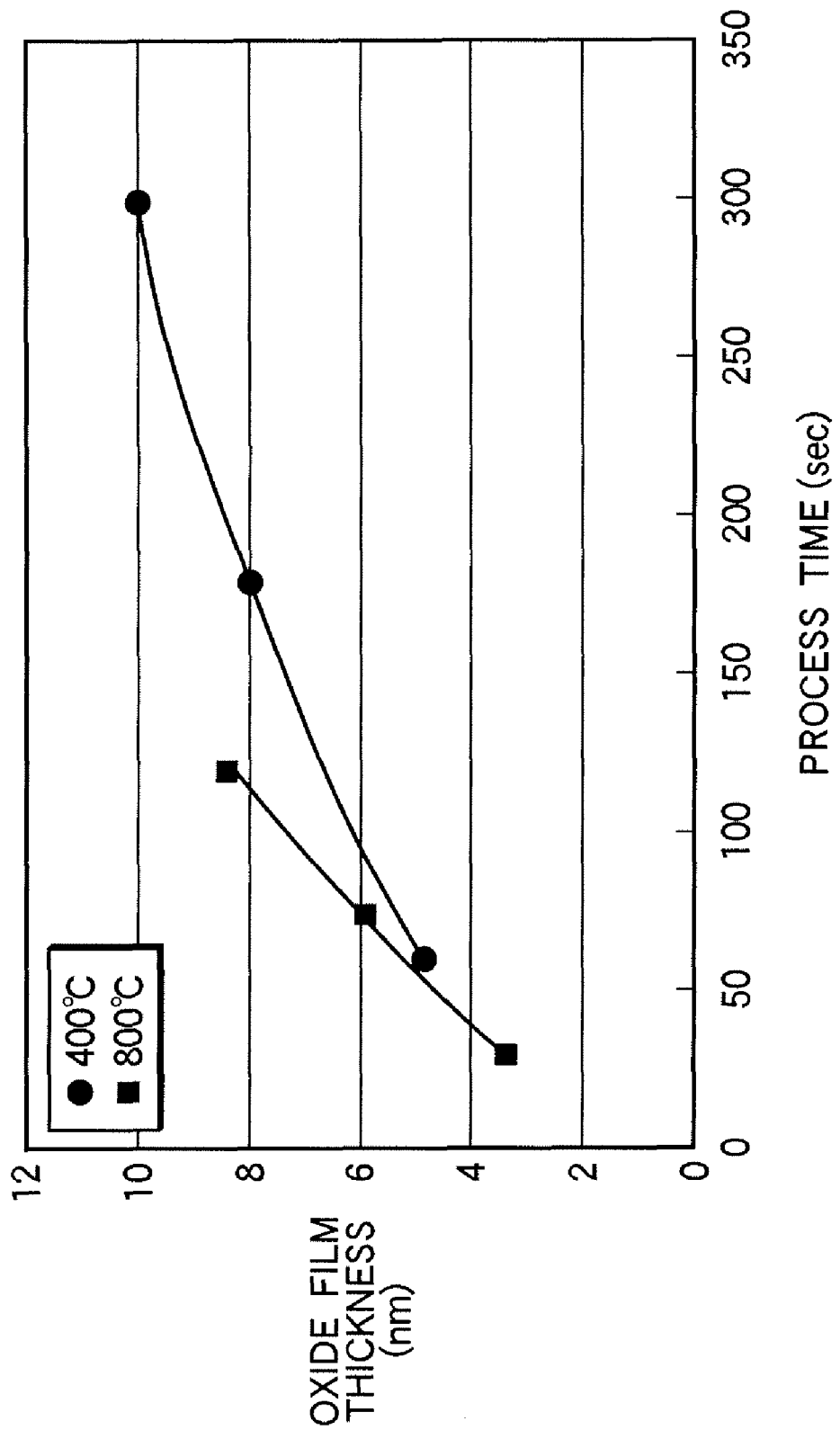
FIG. 15 This is a graph showing the relationship between oxide film thickness and process time in oxidation processes.

Next, an explanation will be given of an experiment result, where sidewall oxidation for a poly-silicon layer 63 was performed in the plasma processing apparatus 100 shown in FIG. 1, while different values of the process temperature (substrate process temperature) were used. Specifically, the process temperature was set at 400° C. and 800° C. The process pressure was set at 6.7 Pa (50 mTorr), the process gas flow rate in the plasma oxidation process at $Ar/O_2/H_2=1,000/100/200$ mL/min (sccm), and the plasma application power at 2.2 kW. FIG. 15 shows a result of this experiment.

As can be seen in FIG. 15, the conditions using a high temperature of 800° C. rendered a higher oxidation rate than that obtained by the conditions using a process temperature of 400° C.

Figure 16:
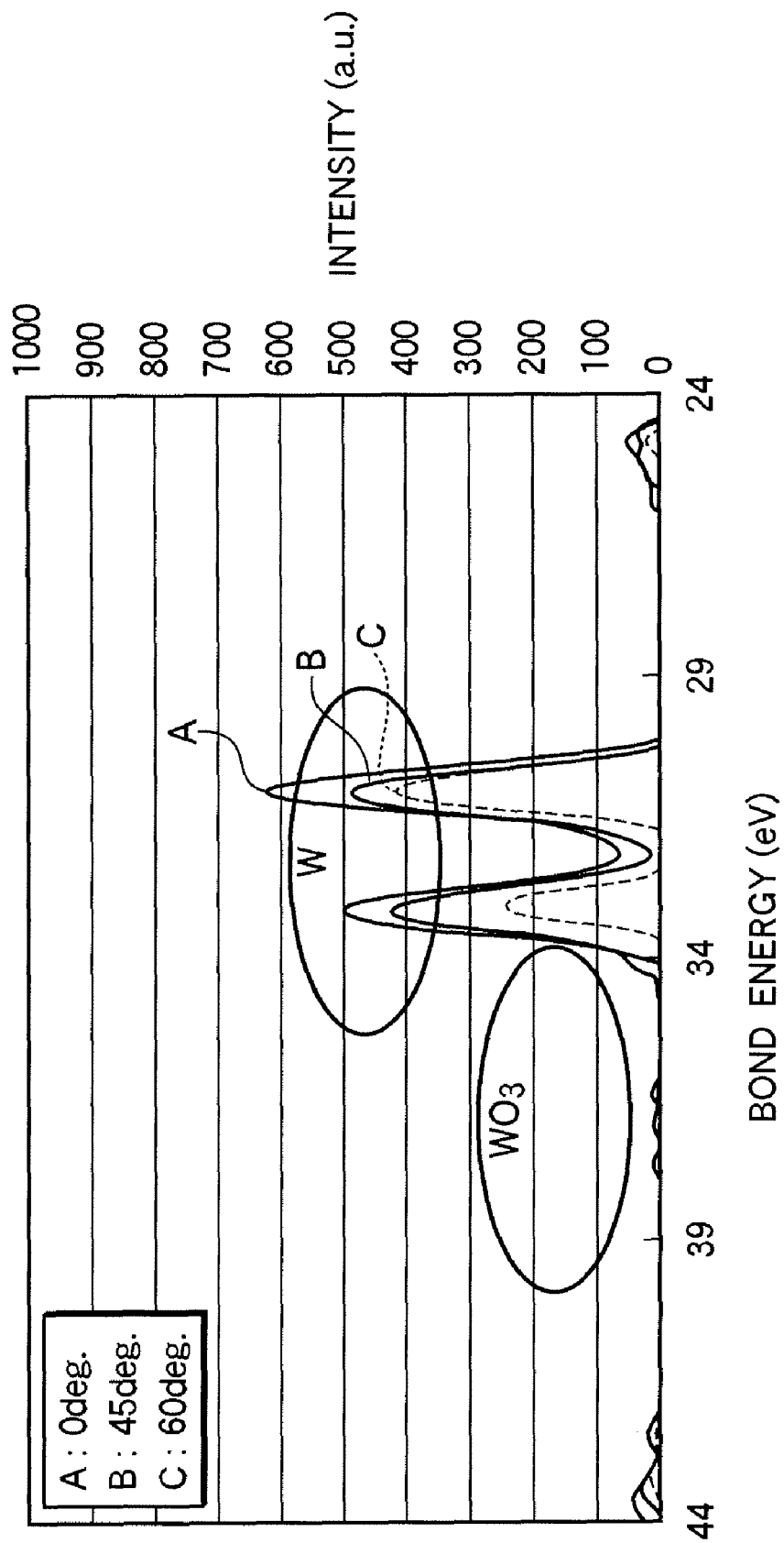
FIG. 16 This is a chart obtained by a surface analysis using an XPS apparatus.

FIG. 16 is a chart showing a result from a surface analysis using an XPS analysis apparatus (X-Ray Photoelectron Spectroscopy Analysis), performed on a wafer covered with blanket tungsten after a plasma process was performed on the wafer in the plasma processing apparatus 100.

In the conditions of the plasma process, the process temperature was set at 800° C., and the other conditions were set to be the same as those of the selective oxidation process described above. Specifically, the $Ar/O_2/H_2$ flow rate was set at 1,000/100/200 mL/min, the process pressure at 6.7 Pa, and the plasma application power at 2.2 kW.

In FIG. 16, a curved line A indicates a measurement result from 0 deg, a curved line B from 45 deg, and a curved line C from 60 deg.

As can be seen in FIG. 16, the peak intensity of WOx ($WO_3$ and so forth) formed by tungsten oxidation was close to zero. Accordingly, it has been found that, where the plasma process is performed in the plasma processing apparatus 100 under oxidation process conditions according to the present invention, not only $WO_3$ formation is suppressed, but also tungsten oxide formed on the surface by natural oxidation during an etching process or thereafter is deoxidized.

Further, a plasma process was performed on a tungsten poly-metal gate structure as shown in FIGS. 4A to 4C, under the same conditions as in the selective oxidation process described above, except for use of a process temperature of 800° C. Then, a picture of a cross-section of the resultant structure was taken by a transmission electron microscope (TEM). As a result, it was confirmed that, as in FIG. 5, no expansion of the tungsten layer 66 was observed, and thus suppression of tungsten oxidation was confirmed (this TEM picture is not shown here).

Accordingly, it has been confirmed that, where a plasma oxidation method according to the present invention is applied to a selective oxidation process of a gate electrode, it is possible to perform selective oxidation for oxidizing only the poly-silicon layer 63 while preventing oxidation of metal, such as the tungsten layer 66.

Figure 17A:
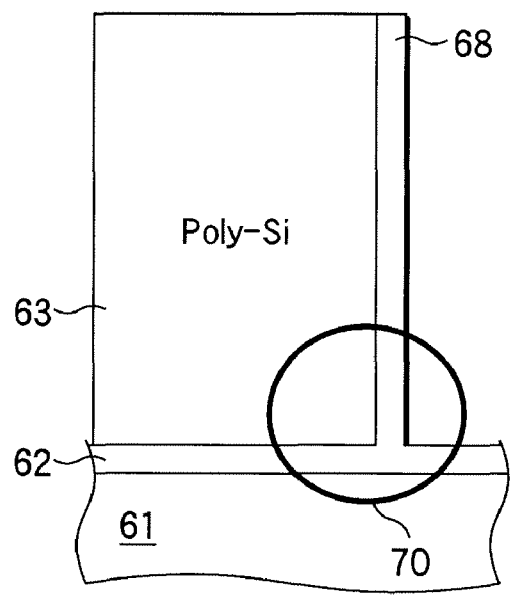
FIG. 17A This is a view schematically showing an example in which the poly-silicon layer of a gate electrode has an edge portion with an acute angle shape.
Figure 17B:
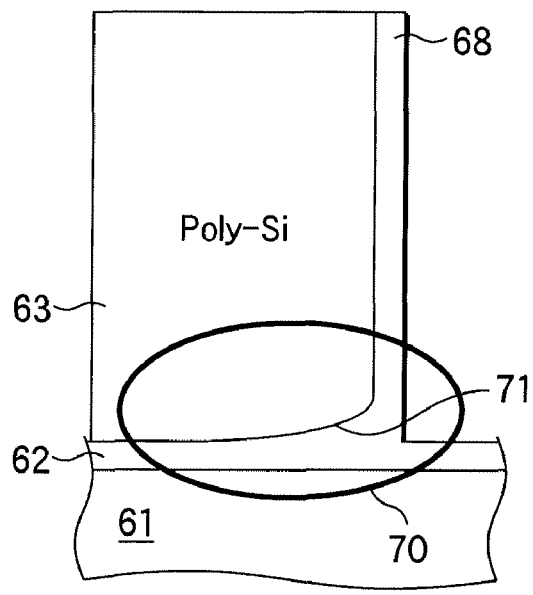
FIG. 17B This is a view schematically showing an example in which the poly-silicon layer of a gate electrode suffers a birds-beak excessively formed therein.
Figure 17C:
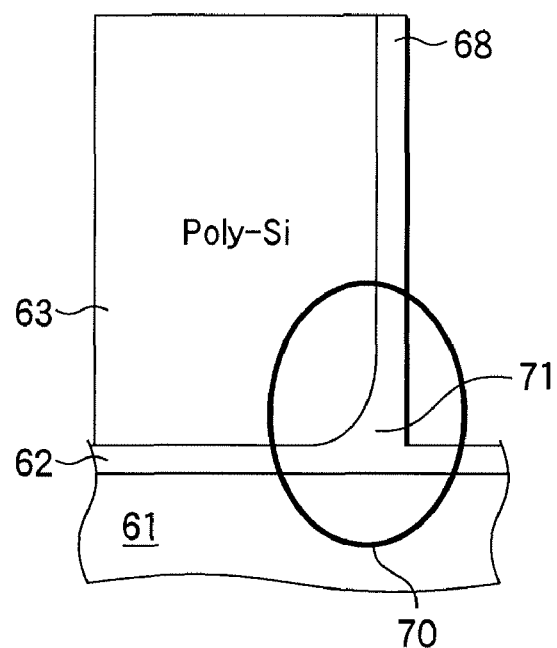
FIG. 17C This is a view schematically showing an example in which the poly-silicon layer of a gate electrode has an edge portion with a rounded shape.

Next, an explanation will be given of control of a birds-beak, with reference to FIGS. 17A to 17C. As described previously, in a state where the side surface of a poly-silicon layer included in a gate electrode is exposed, when a voltage is applied to the gate electrode, an electric field is concentrated at this exposed portion, which may cause malfunctions of the product, such as an increase in leakage current. Accordingly, a re-oxidation process is performed to oxidize this exposed portion and thereby form an insulating film. FIGS. 17A to 17C are views schematically showing the shape of an edge portion (corner portion) 70 of a poly-silicon layer 63 after the re-oxidation process.

FIG. 17A shows a state of the edge portion 70 which includes no birds-beak 71 formed therein and has an acute angle shape.

On the other hand, FIG. 17B shows a state of the edge portion 70 with a birds-beak 71 formed therein. In this case, active oxidizing agents, such as oxygen radicals (O*) and oxygen ions (O−), are diffused into the interface between the poly-silicon layer 63 and Si substrate 61, and oxidize this portion to grow an oxide film (gate insulating film 62). Particularly, such a birds-beak 71 tends to be easily formed during a thermal oxidation process.

Where re-oxidation using RLSA microwave plasma is performed in the plasma processing apparatus 100 shown in FIG. 1, this process provides the merit of suppressing a birds-beak, which is a serious problem caused by thermal oxidation processes. However, where a birds-beak is not at all formed as shown in FIG. 17A, the edge portion 70 of the poly-silicon layer 63, at which an electric field tends to concentrate, becomes acute, thereby further increasing the leakage current. Accordingly, in this embodiment, a re-oxidation process is performed at a high temperature of 600° C. or more, and the edge portion 70 of the poly-silicon layer 63 is thereby slightly rounded, as shown in FIG. 17C. This state makes it possible to realize a gate electrode with high reliability, while preventing the leakage current at the edge portion 70 from being increased, and preventing the gate oxide film from being thicker to meet miniaturization.

A plasma oxidation process was performed as a re-oxidation process on a gate electrode having a tungsten poly-metal gate structure as shown in FIG. 4A, in the plasma processing apparatus 100 shown in FIG. 1. In this process, the process pressure was set at 6.7 Pa (50 mTorr). Further, in the plasma oxidation process, the process gas flow rate was set at $Ar/O_2/H_2=1,000/100/200$ mL/min (sccm), the process temperature (substrate process temperature) at 800° C., the plasma application power at 2.2 kW, and the process time at 80 seconds.

Figure 18:
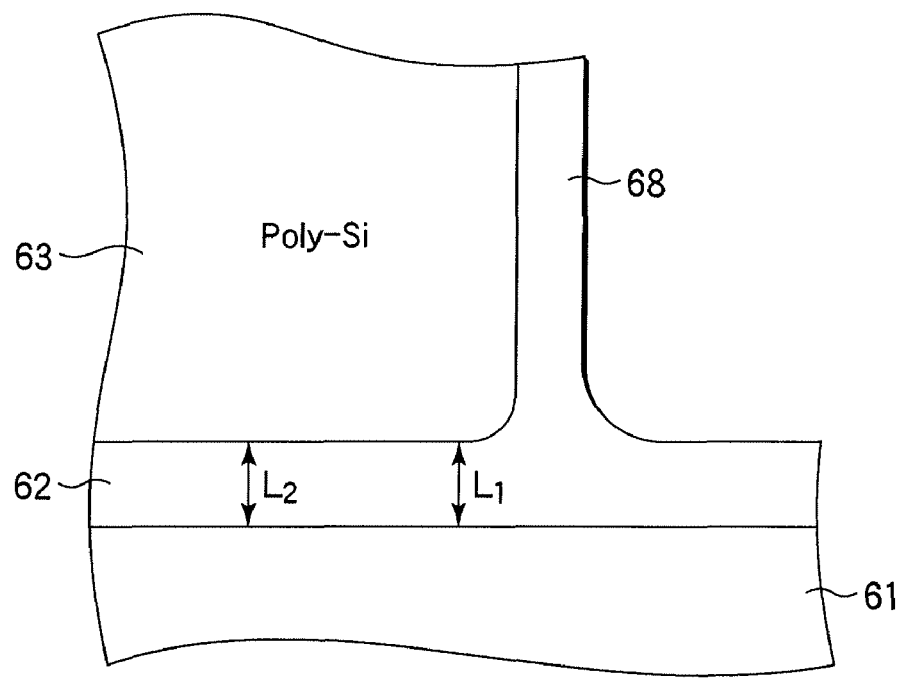
FIG. 18 This is a view schematically showing a TEM picture of a cross-section of an edge portion of a poly-silicon layer after a selective oxidation process.

FIG. 18 is a view schematically showing a TEM picture of a cross-section around an edge portion of a poly-silicon layer 63 after the re-oxidation process performed under the conditions described above. As a result of this plasma oxidation process, an oxide film 68 was preferentially formed on the sidewall of the poly-silicon layer 63, and the edge portion was slightly rounded, as shown in FIG. 18. Further, as regards an oxide film (gate insulating film 62) below the poly-silicon layer 63, the thickness thereof below the edge of the poly-silicon layer (film thickness L1) was almost equal to that below the center of the poly-silicon layer (L1=L2). Accordingly, it was confirmed that no birds-beak was formed.

From the results described above, it has been found that, where the re-oxidation process is performed at a high temperature of 600° C. or more, such as 600 to 900° C., it is possible to suppress the birds-beak and to round the edge portion, thereby decreasing the gate leakage current.

The present invention has been described with reference to embodiments, but the present invention is not limited to the embodiments described above, and it may be modified in various manners.

For example, the gate electrode is not limited to a structure including tungsten or tungsten silicide laminated on poly-silicon, and it may have a structure including a high-melting point electrode material or silicide thereof laminated on poly-silicon.

Further, the present invention may be applied to a method for manufacturing any one of various semiconductor devices other than the gate electrode of a transistor, which need selective oxidation for oxidizing a silicon-containing material while suppressing oxidation of a metal material.

INDUSTRIAL APPLICABILITY

The present invention is preferably utilized for manufacturing various semiconductor devices.

The invention claimed is:

1. A semiconductor device manufacturing method for processing substrates one by one, each substrate having a laminated structure formed thereon, which includes a poly-silicon layer and a metal layer containing a refractory metal as a main component, the method comprising:
supplying a process gas consisting essentially of Ar gas, $H_2$ gas, and $O_2$ gas into a process chamber that accommodates the substrate;
supplying microwaves into the process chamber from a plurality of slots formed in a planar antenna disposed on the process chamber to generate plasma of the process gas by the microwaves inside the process chamber; and
subjecting the laminated structure to a plasma oxidation process of oxidizing the poly-silicon layer preferentially to the metal layer by the plasma to form an oxide film on the poly-silicon layer,
wherein the process gas has a flow rate ratio of the $H_2$ gas relative to the $O_2$ gas set at a value of 8 to 12 and the process chamber has a process temperature of 400 to 600° C. set therein during the plasma oxidation process, not only to prevent the metal layer from being oxidized but also to prevent metal contamination from occurring inside the process chamber and to prevent inter-substrate process uniformity from deteriorating.

2. The semiconductor device manufacturing method according to claim 1, wherein the metal layer is a tungsten layer or tungsten silicide layer.

3. A plasma oxidation method for processing substrates one by one, each substrate having a laminated structure formed thereon, which includes a silicon layer and a metal layer containing a refractory metal as a main component, the method comprising:
supplying a process gas consisting essentially of Ar gas, $H_2$ gas, and $O_2$ gas into a process chamber that accommodates the substrate;
supplying microwaves into the process chamber from a plurality of slots formed in a planar antenna disposed on the process chamber to generate plasma of the process gas by the microwaves inside the process chamber; and
subjecting the laminated structure to a plasma oxidation process of oxidizing the silicon layer preferentially to the metal layer by the plasma to form an oxide film on the silicon layer,
wherein the process gas has a flow rate ratio of the $H_2$ gas relative to the $O_2$ gas set at a value of 8 to 12 and the process chamber has a process temperature of 400 to 600° C. set therein during the plasma oxidation process, not only to prevent the metal layer from being oxidized but also to prevent metal contamination from occurring inside the process chamber and to prevent inter-substrate process uniformity from deteriorating.

4. The plasma oxidation method according to claim 3, wherein the metal layer is a tungsten layer or tungsten silicide layer.

5. The plasma oxidation method according to claim 3, wherein in supplying the process gas, a flow rate ratio of the Ar gas relative to the $H_2$ gas is set at a value of 1.25 to 10.

6. The plasma oxidation method according to claim 3, wherein the plasma oxidation process is performed by using a pressure of 3 to 700 Pa inside the process chamber.

7. The semiconductor manufacturing method according to claim 1, wherein the plasma process is performed by using a pressure of 3 to 700 Pa inside the process chamber.

8. The semiconductor device manufacturing method according to claim 1, wherein the method comprises rounding an edge portion of the poly-silicon layer when oxidizing the poly-silicon layer preferentially to the metal layer.

9. The plasma oxidation method according to claim 3, wherein the method comprises rounding an edge portion of the silicon layer when oxidizing the silicon layer preferentially to the metal layer.

10. The semiconductor device manufacturing method according to claim 1, wherein, in said supplying the process gas, a flow rate ratio of the Ar gas relative to the $H_2$ gas is set at a value of 1.25 to 10.

11. The semiconductor device manufacturing method according to claim 1, wherein, in said supplying the process gas, the Ar gas is set at a flow rate of 100 to 3,000 mL/min, and the $H_2$ gas is set at a flow rate of 10 to 1,000 mL/min.

12. The semiconductor device manufacturing method according to claim 1, wherein the plasma has an electron temperature of 0.7 to 2 eV.

13. The plasma oxidation method according to claim 3, wherein, in said supplying the process gas, the Ar gas is set at a flow rate of 100 to 3,000 mL/min, and the $H_2$ gas is set at a flow rate of 10 to 1,000 mL/min.

14. The plasma oxidation method according to claim 3, wherein the plasma has an electron temperature of 0.7 to 2 eV.

15. The semiconductor device manufacturing method according to claim 1, wherein the metal layer is a tungsten layer.

16. The semiconductor device manufacturing method according to claim 1, wherein the flow rate ratio is set at a value of 8 to 10.

17. The plasma oxidation method according to claim 3, wherein the metal layer is a tungsten layer.

18. The plasma oxidation method according to claim 3, wherein the flow rate ratio is set at a value of 8 to 10.

* * * * *